(12) United States Patent
Livsey et al.

(10) Patent No.: US 10,454,408 B2
(45) Date of Patent: Oct. 22, 2019

(54) PHOTOVOLTAIC ROOFING ELEMENTS AND PHOTOVOLTAIC ROOFING SYSTEMS

(71) Applicant: CertainTeed Corporation, Malvern, PA (US)

(72) Inventors: Robert D. Livsey, Limerick, PA (US); Joseph Charles Gombarick, Phoenixville, PA (US); Peter Chihlas, Lansdale, PA (US); Husnu M. Kalkanoglu, Swarthmore, PA (US); Michael E. Blackburn, Wichita, KS (US); Stephen W. Steffes, McPherson, KS (US); Gregory F. Jacobs, Oreland, PA (US); Michael J. Noone, Wayne, PA (US)

(73) Assignee: CertainTeed Corporation, Malvern, PA (US)

( * ) Notice: Subject to any disclaimer, the term of this patent is extended or adjusted under 35 U.S.C. 154(b) by 0 days.

(21) Appl. No.: 15/683,401

(22) Filed: Aug. 22, 2017

(65) Prior Publication Data

US 2018/0097471 A1 Apr. 5, 2018

Related U.S. Application Data

(63) Continuation of application No. 14/993,901, filed on Jan. 12, 2016, now Pat. No. 9,755,573, which is a
(Continued)

(51) Int. Cl.
*H02S 20/25* (2014.01)
*E04D 13/158* (2006.01)
(Continued)

(52) U.S. Cl.
CPC ............ *H02S 20/25* (2014.12); *E04B 1/7069* (2013.01); *E04D 1/12* (2013.01); *E04D 1/30* (2013.01);
(Continued)

(58) Field of Classification Search
CPC .......... H02S 20/25; H02S 20/00; H02S 20/23; H01L 31/0481; H01L 31/042; F24S 25/61;
(Continued)

(56) References Cited

U.S. PATENT DOCUMENTS

| | | | |
|---|---|---|---|
| 3,579,940 A | 5/1971 | Greenleaf | |
| 4,870,796 A * | 10/1989 | Hart | .......................... E04D 7/00 52/409 |

(Continued)

*Primary Examiner* — Basil S Katcheves
*Assistant Examiner* — Omar F Hijaz
(74) *Attorney, Agent, or Firm* — McDonnell Boehnen Hulbert & Berghoff LLP

(57) ABSTRACT

The present invention relates generally to the photovoltaic generation of electrical energy. The present invention relates more particularly to photovoltaic arrays for use in photovoltaically generating electrical energy. Aspects of the present invention provide a variety of photovoltaic roofing elements and systems that include, for example, interlocking geometries to provide for water handling and integration with conventional roofing materials; and wire management features that can protect wiring and associated electrical components from physical and/or environmental damage.

8 Claims, 30 Drawing Sheets

Related U.S. Application Data continuation of application No. 14/715,278, filed on May 18, 2015, now Pat. No. 9,270,224, which is a continuation of application No. 14/159,978, filed on Jan. 21, 2014, now Pat. No. 9,032,672, which is a continuation of application No. 13/326,094, filed on Dec. 14, 2011, now Pat. No. 8,631,614.

(60) Provisional application No. 61/429,053, filed on Dec. 31, 2010, provisional application No. 61/528,631, filed on Aug. 29, 2011, provisional application No. 61/559,614, filed on Nov. 14, 2011.

(51) Int. Cl.

| | | |
|---|---|---|
| *F24S 25/61* | (2018.01) | |
| *E04B 1/70* | (2006.01) | |
| *H01L 31/048* | (2014.01) | |
| *H02S 20/00* | (2014.01) | |
| *E04D 13/16* | (2006.01) | |
| *E04D 13/04* | (2006.01) | |
| *H02S 20/23* | (2014.01) | |
| *E04D 1/12* | (2006.01) | |
| *E04D 1/30* | (2006.01) | |
| *E04D 13/00* | (2006.01) | |
| *E04D 13/14* | (2006.01) | |

(52) U.S. Cl.
CPC ............ *E04D 13/00* (2013.01); *E04D 13/04* (2013.01); *E04D 13/158* (2013.01); *E04D 13/16* (2013.01); *F24S 25/61* (2018.05); *H01L 31/048* (2013.01); *H01L 31/0481* (2013.01); *H02S 20/00* (2013.01); *H02S 20/23* (2014.12); *E04D 13/1415* (2013.01); *E04D 2001/308* (2013.01); *Y02B 10/12* (2013.01); *Y02E 10/50* (2013.01); *Y10T 29/49826* (2015.01)

(58) Field of Classification Search
CPC .. E04D 1/12; E04D 13/00; E04D 1/30; E04D 13/158; E04D 13/16; E04D 13/04; E04D 2001/3008; E04D 13/1415; E04B 1/7069
See application file for complete search history.

(56) References Cited

U.S. PATENT DOCUMENTS

| | | | |
|---|---|---|---|
| 5,457,057 A | 10/1995 | Nath et al. | |
| 5,968,287 A | 10/1999 | Nath | |
| 6,370,828 B1 | 4/2002 | Genschorek | |
| 6,606,830 B2 * | 8/2003 | Nagao ..................... | F24S 25/40 52/173.3 |
| 6,809,253 B2 | 10/2004 | Dinwoodie | |
| 7,003,922 B2 | 2/2006 | Fifield | |
| 7,012,188 B2 * | 3/2006 | Erling .................... | H02S 20/23 136/251 |
| 7,138,578 B2 | 11/2006 | Komamine | |
| 7,297,867 B2 | 11/2007 | Nomura | |
| 7,328,534 B2 | 2/2008 | Dinwoodie | |
| 7,915,519 B2 | 3/2011 | Kobayashi | |
| 8,141,306 B2 | 3/2012 | Masuda et al. | |
| 8,266,846 B2 | 9/2012 | Schoell | |
| 8,601,754 B2 | 12/2013 | Jenkins et al. | |
| 8,631,614 B2 | 1/2014 | Livsey et al. | |
| 8,959,848 B2 | 2/2015 | Jenkins et al. | |
| 9,032,672 B2 | 5/2015 | Livsey et al. | |
| 2002/0043031 A1 | 4/2002 | Eguchi | |
| 2006/0196128 A1 * | 9/2006 | Duke ..................... | H02S 20/23 52/173.3 |
| 2008/0289272 A1 * | 11/2008 | Flaherty .................. | H02S 20/25 52/173.3 |
| 2008/0302030 A1 | 12/2008 | Stancel et al. | |
| 2008/0313976 A1 * | 12/2008 | Allen .................... | H01L 31/048 52/173.1 |
| 2009/0019795 A1 | 1/2009 | Szacsvay | |
| 2010/0065108 A1 * | 3/2010 | West ...................... | F24S 25/20 136/251 |
| 2010/0132274 A1 | 6/2010 | Reyal | |
| 2010/0236162 A1 | 9/2010 | Tweedie | |
| 2010/0242381 A1 * | 9/2010 | Jenkins ................... | H02S 20/23 52/173.3 |
| 2011/0083381 A1 * | 4/2011 | David ..................... | H02S 20/23 52/173.3 |
| 2011/0302857 A1 | 12/2011 | McClellan | |
| 2011/0302859 A1 | 12/2011 | Crasnianski | |
| 2012/0137600 A1 | 6/2012 | Jenkins | |
| 2012/0186630 A1 | 7/2012 | Jenkins et al. | |
| 2015/0326170 A1 | 11/2015 | Livsey et al. | |

\* cited by examiner

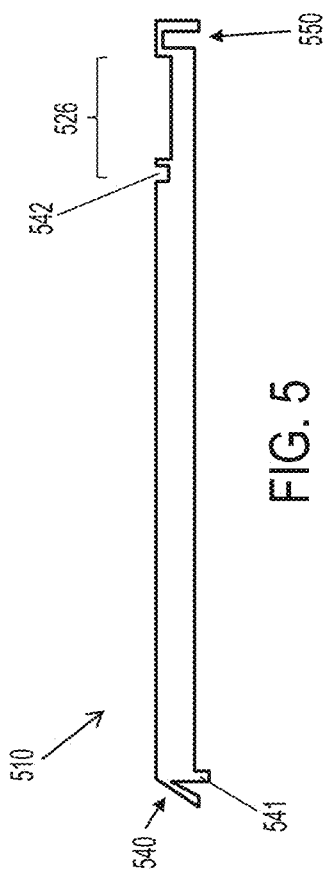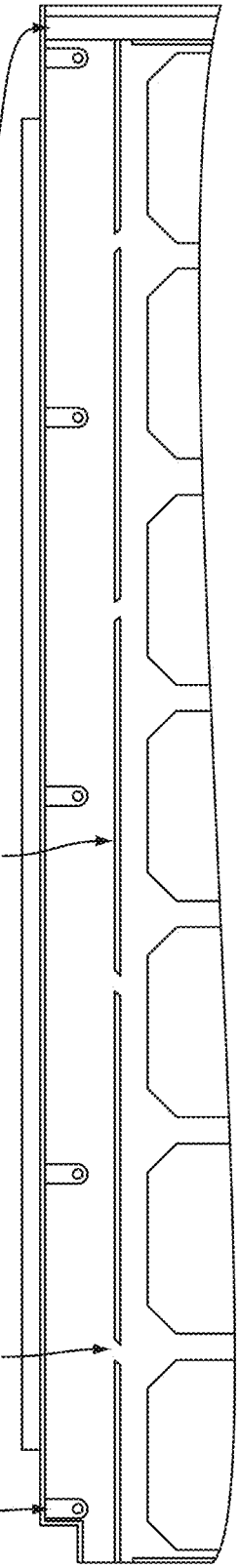
FIG. 5
FIG. 6

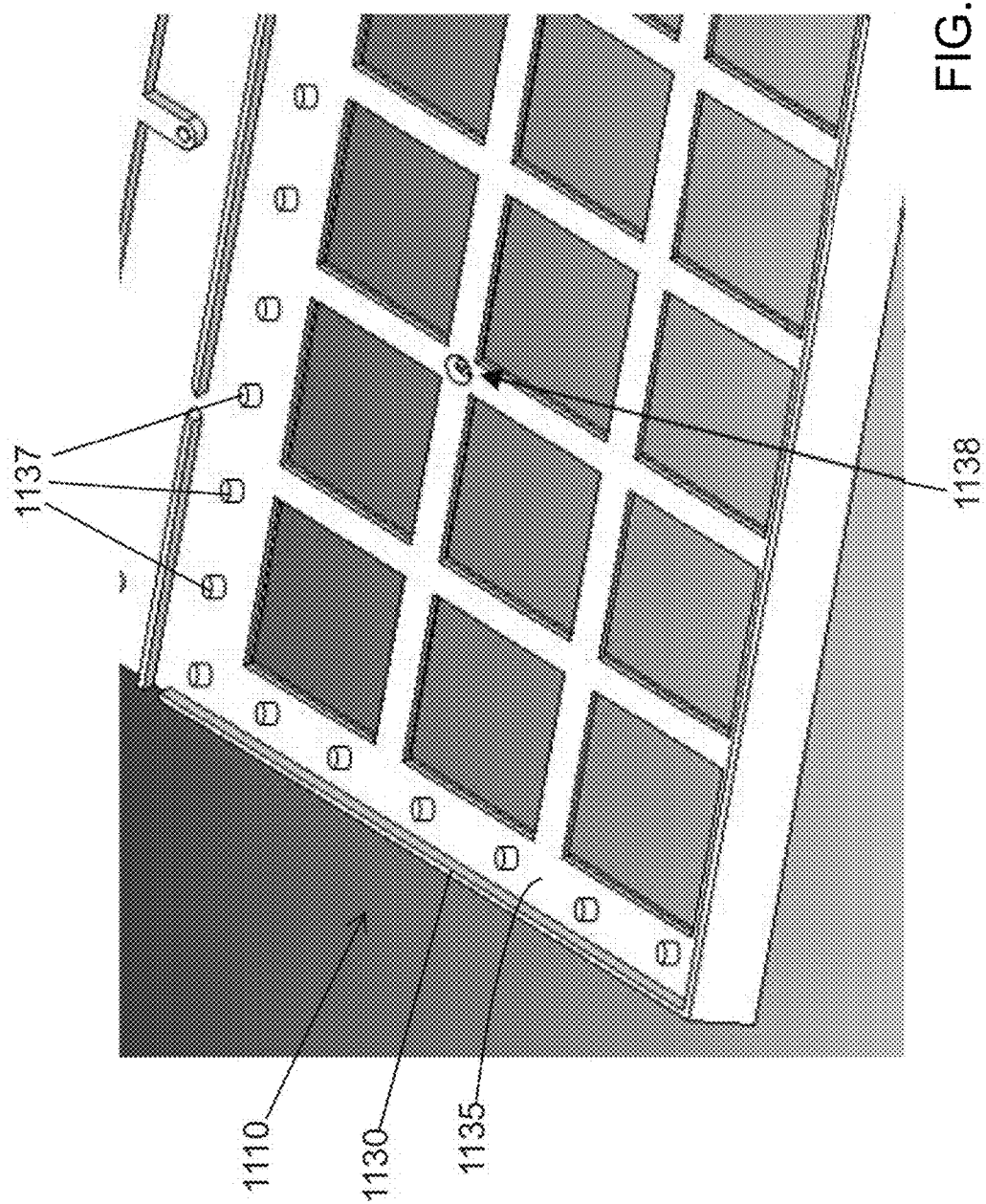

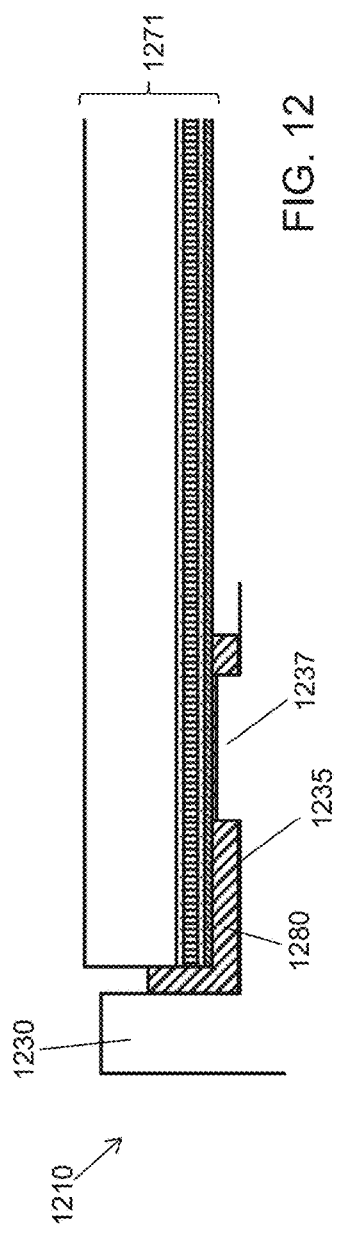
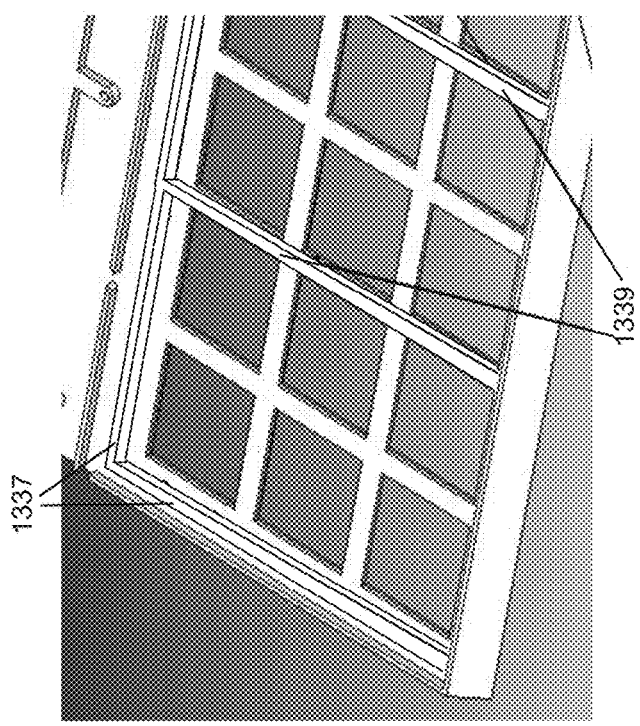

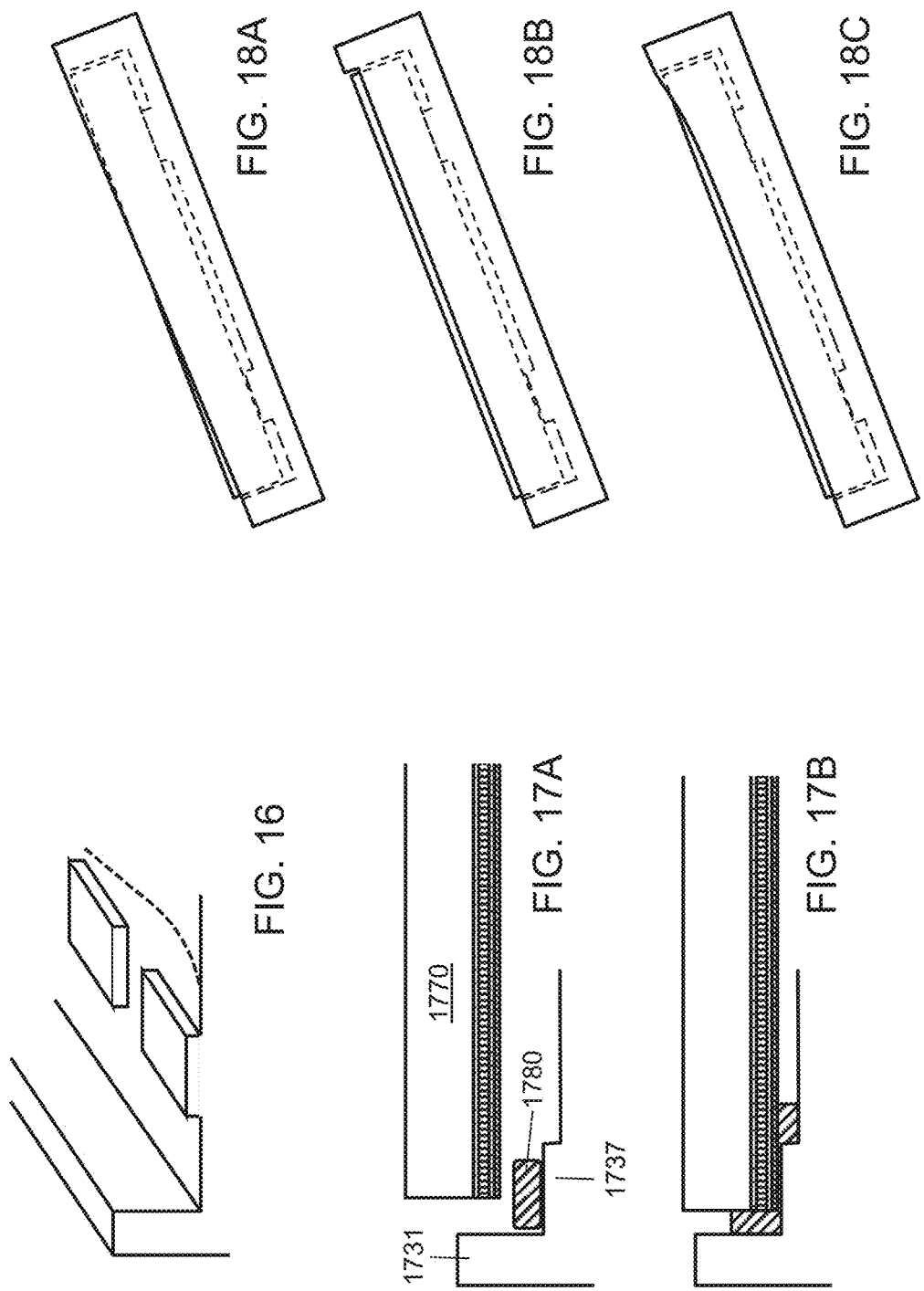

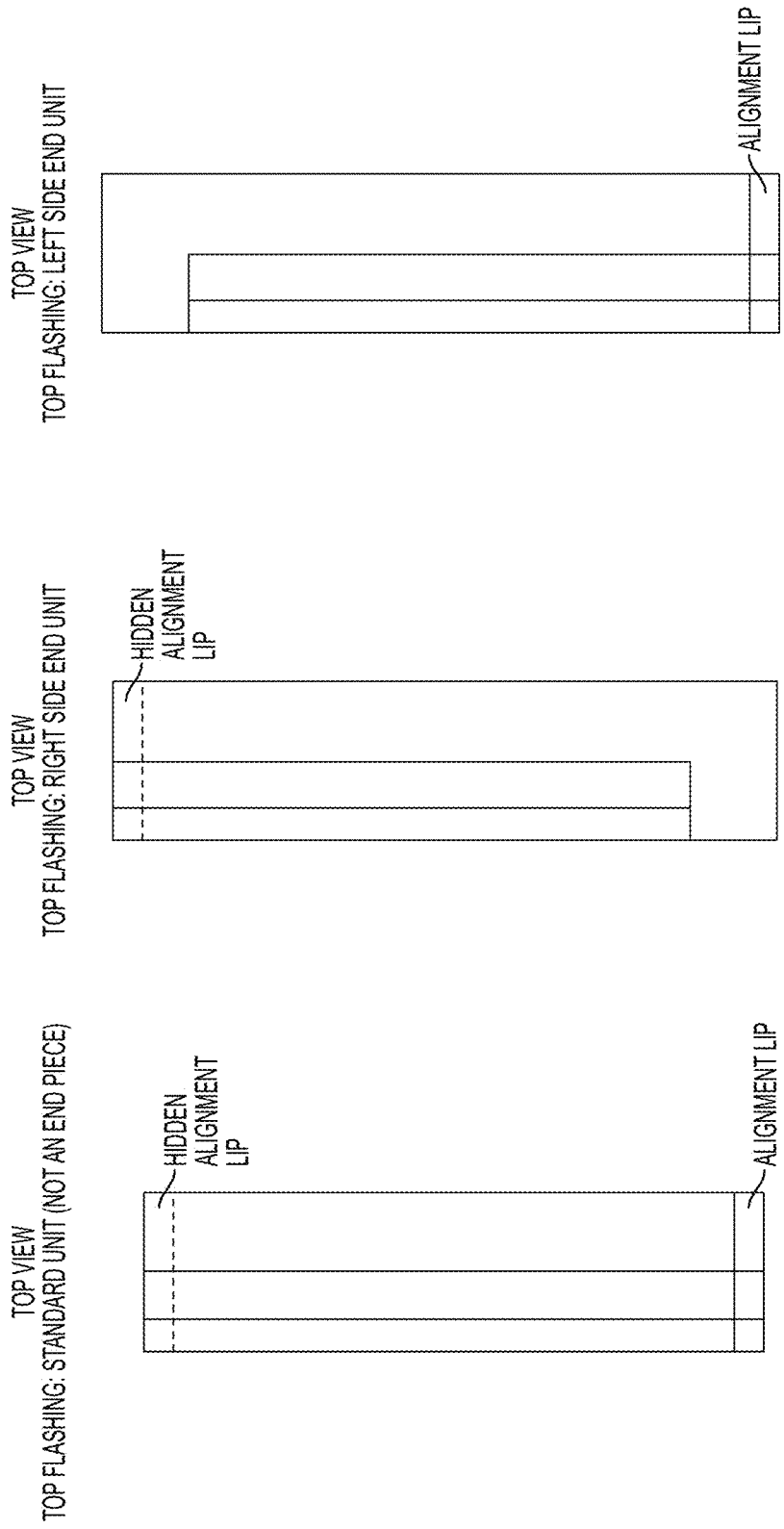

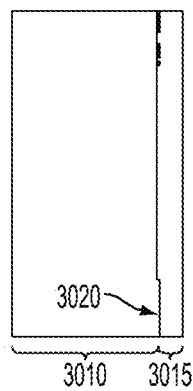
TOP VIEW
BACK VIEW
FRONT VIEW
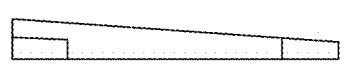
SIDE VIEW
FIG. 30

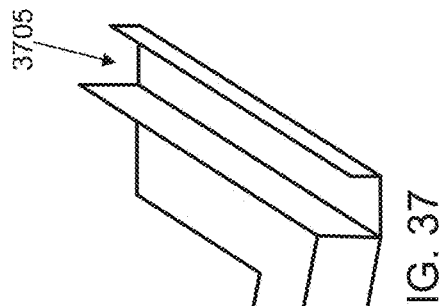
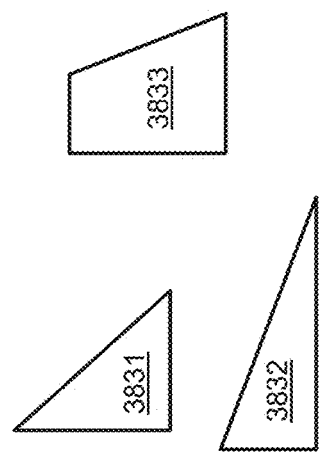
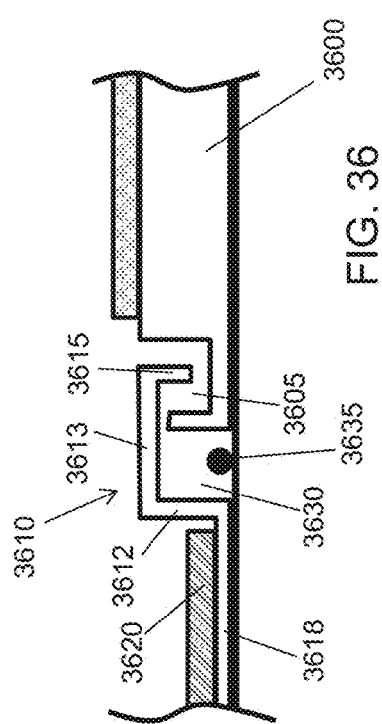
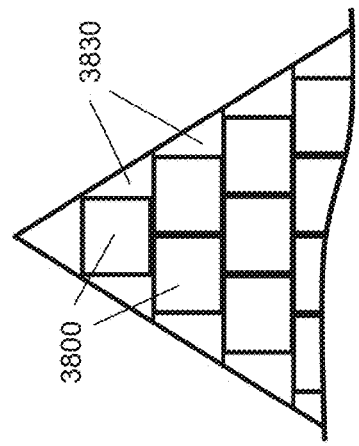

PHOTOVOLTAIC ROOFING ELEMENTS AND PHOTOVOLTAIC ROOFING SYSTEMS

CROSS-REFERENCE TO RELATED APPLICATIONS

The present application is a continuation of U.S. patent application Ser. No. 14/993,901, U.S. Pat. No. 9,755,573, which is a continuation of U.S. patent application Ser. No. 14/715,278, U.S. Pat. No. 9,270,224; which is a continuation of U.S. patent application Ser. No. 14/159,278, U.S. Pat. No. 9,032,672, which is a continuation of U.S. patent application Ser. No. 13/326,094, U.S. Pat. No. 8,631,614, which claims priority to U.S. Provisional Patent Application Ser. No. 61/429,053; U.S. Provisional Patent Application Ser. No. 61/528,631; and U.S. Provisional Patent Application Ser. No. 61/559,614, each of which is hereby incorporated herein by reference in its entirety.

BACKGROUND OF THE INVENTION

1. Field of the Invention

The present invention relates generally to the photovoltaic generation of electrical energy. The present invention relates more particularly to photovoltaic roofing products for use in photovoltaically generating electrical energy.

2. Technical Background

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as system performance has improved. They can be used, for example, to provide at least a significant fraction of the electrical energy needed for a building's overall function; or they can be used to power one or more particular devices, such as exterior lighting systems and well pumps.

Accordingly, research and development attention has turned toward the development of photovoltaic products that are adapted to be installed on a roof. While stand-alone photovoltaic modules have been in use for some time, they tend to be heavy and bulky, and aesthetically unfavorable when installed on a roof. Roofing products having photovoltaic cells integrated with roofing products such as shingles, shakes or tiles, or roofing panels have been proposed. Examples of such proposals have been disclosed in U.S. Patent Application Publications nos. 2006/0042683A1, 2008/0149163A1, 2010/0313499A1 and 2010/0313501A1, and in U.S. Pat. No. 4,040,867, each of which is hereby incorporated by reference herein in its entirety. A plurality of such photovoltaic roofing elements (i.e., including photovoltaic media integrated with a roofing product) can be installed together on a roof, and electrically interconnected to form a photovoltaic roofing system that provides both environmental protection and photovoltaic power generation. These can be very advantageous, but can be difficult to install on steep surfaces, while ensuring sufficient closure of the roof against the elements, particularly wind driven rain, and can often result in incomplete coverage of the roof surface with photovoltaic power generation. Moreover, as it is often desirable to have photovoltaic roofing elements covering a portion of a roof surface and conventional roofing products covering the remainder of the surface, there is a need for systems that provide aesthetic effect in the transition zone between the conventional roofing products and the photovoltaic roofing elements while closing the roof and the array of photovoltaic roofing elements to the environment.

Individual photovoltaic roofing elements within a larger photovoltaic roofing system are often electrically interconnected using wiring such as wires or cables. Similarly, wiring is often used to connect the array to an electrical system. But in many systems, the wiring is at risk of being dislocated, being damaged, or being pinched or bent into a radius tighter than allowed by code during handling and installation. This risk is especially high when the photovoltaic roofing element includes support structures such as downward-facing ribs, as the installer may not be able to determine if wiring is pinched between the support structure and the underlying roof deck. Damaged wire can cause power loss over time, injury, or fire, and is therefore undesirable.

There remains a need for photovoltaic products that address one or more of these deficiencies.

SUMMARY OF THE INVENTION

One aspect of the invention is a frame structure having an upward-facing surface and a downward-facing surface, the frame structure having an attachment zone and an exposure zone, with the exposure zone disposed toward the bottom end of the frame structure, and the attachment zone disposed toward the top end of the frame structure; and one or more photovoltaic elements held in the exposure zone of the frame structure.

Another aspect of the invention is a frame structure having an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further including a wiring containment structure; and one or more photovoltaic elements held in the exposure zone of the frame structure.

Another aspect of the invention is a frame structure having an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further including includes sidelap portions disposed at its lateral edges and having geometries adapted to interlock with adjacent photovoltaic roofing elements to provide water drainage channels; and one or more photovoltaic elements held in the exposure zone of the frame structure.

Another aspect of the invention is a photovoltaic roofing system disposed on a roof deck having an top end and a bottom end, the photovoltaic roofing system comprising: one or more photovoltaic roofing elements as described herein; a plurality of roofing elements disposed adjacent the contiguously-disposed photovoltaic roofing elements, along their side edges; and side flashing elements disposed along the side edges of the contiguously-disposed photovoltaic roofing elements, the side flashing elements having a cross-sectional shape comprising a vertically-extending feature and a flange extending away from a lateral side at the downward end of the vertically-extending feature, with the flange facing away from the contiguously-disposed photovoltaic roofing elements and being at least partially disposed between a roofing element and the roof deck, the vertically-extending feature including a matched interlocking geometry adapted to interlock with the sidelap portion of an adjacent photovoltaic roofing element.

Another aspect of the invention is a method for installing a photovoltaic roofing system on a roof deck having a top end and a bottom end, the roof deck having disposed thereon a plurality of roofing elements method including contiguously disposing one or more photovoltaic roofing elements on the roof deck, each photovoltaic roofing element comprising a frame structure having an upward-facing surface and a downward-facing surface having a top end and a bottom end, the frame structure having an attachment zone and an exposure zone, with the exposure zone disposed toward the bottom end of the frame structure, and the attachment zone disposed toward the top end of the frame structure; and one or more photovoltaic elements held in the exposure zone of the frame structure, the contiguously-disposed photovoltaic elements together having a top edge facing the top end of the roof deck, a bottom edge facing the bottom end of the roof deck, and two side edges wherein the roofing elements are disposed along the side edges, the sidelap portions of the photovoltaic roofing elements interlocking to provide water drainage channels; and disposing side flashing elements disposed along the side edges of the contiguously-disposed photovoltaic roofing elements, the side flashing elements having a cross-sectional shape comprising a vertically-extending feature and a flange extending away from a lateral side at the downward end of the vertically-extending feature, with the flange facing away from the contiguously-disposed photovoltaic roofing elements and being at least partially disposed between a roofing element and the roof deck, the vertically-extending feature including a matched interlocking geometry adapted to interlock with the sidelap portion of an adjacent photovoltaic roofing element.

The invention will be further described with reference to embodiments depicted in the appended figures. It will be appreciated that elements in the figures are illustrated for simplicity and clarity and have not necessarily been drawn to scale. For example, the dimensions of some of the elements in the figures may be exaggerated relative to other elements to help to improve understanding of embodiments of the invention.

BRIEF DESCRIPTION OF THE DRAWINGS

The accompanying drawings are not necessarily to scale, and sizes of various elements can be distorted for clarity.

FIG. 5 is a schematic cross-sectional view of a frame structure according to one embodiment of the invention;

FIG. 6 is a schematic plan view of a frame structure according to one embodiment of the invention;

FIG. 11 is a perspective schematic view of a frame structure suitable for use in certain embodiments of the invention;

FIG. 12 is a cross-sectional partial schematic view of a photovoltaic roofing element according to one embodiment of the invention;

FIG. 13 is perspective schematic view of a frame structure suitable for use in certain embodiments of the invention;

FIG. 16 is a perspective/cross-sectional schematic view of a frame structure suitable for use in certain embodiments of the invention;

FIGS. 17A and 17B are partial cross-sectional partial schematic views of the installation of a photovoltaic element in a frame structure according to one embodiment of the invention;

FIGS. 18A, 18B and 18C are edge partial schematic views of photovoltaic roofing elements according to certain embodiments of the invention;

FIGS. 24A and 24B top are and bottom perspective schematic views, respectively, of a starter strip for use an array of photovoltaic roofing elements according to certain embodiments of the invention;

FIGS. 27-29 are schematic top and edge views of top flashing pieces suitable for use in certain embodiments of the invention;

FIG. 30 is a set of schematic views of side flashing pieces suitable for use in certain embodiments of the invention;

FIG. 36 is a schematic cross-sectional view of interlocking photovoltaic roofing elements according to one embodiment of the invention;

FIG. 37 is a schematic perspective view of a stepped side flashing piece according to one embodiment of the invention FIG. 38 is a schematic plan view of angled side inserts suitable for use in certain embodiments of the invention;

DETAILED DESCRIPTION OF THE INVENTION

Figure 1:
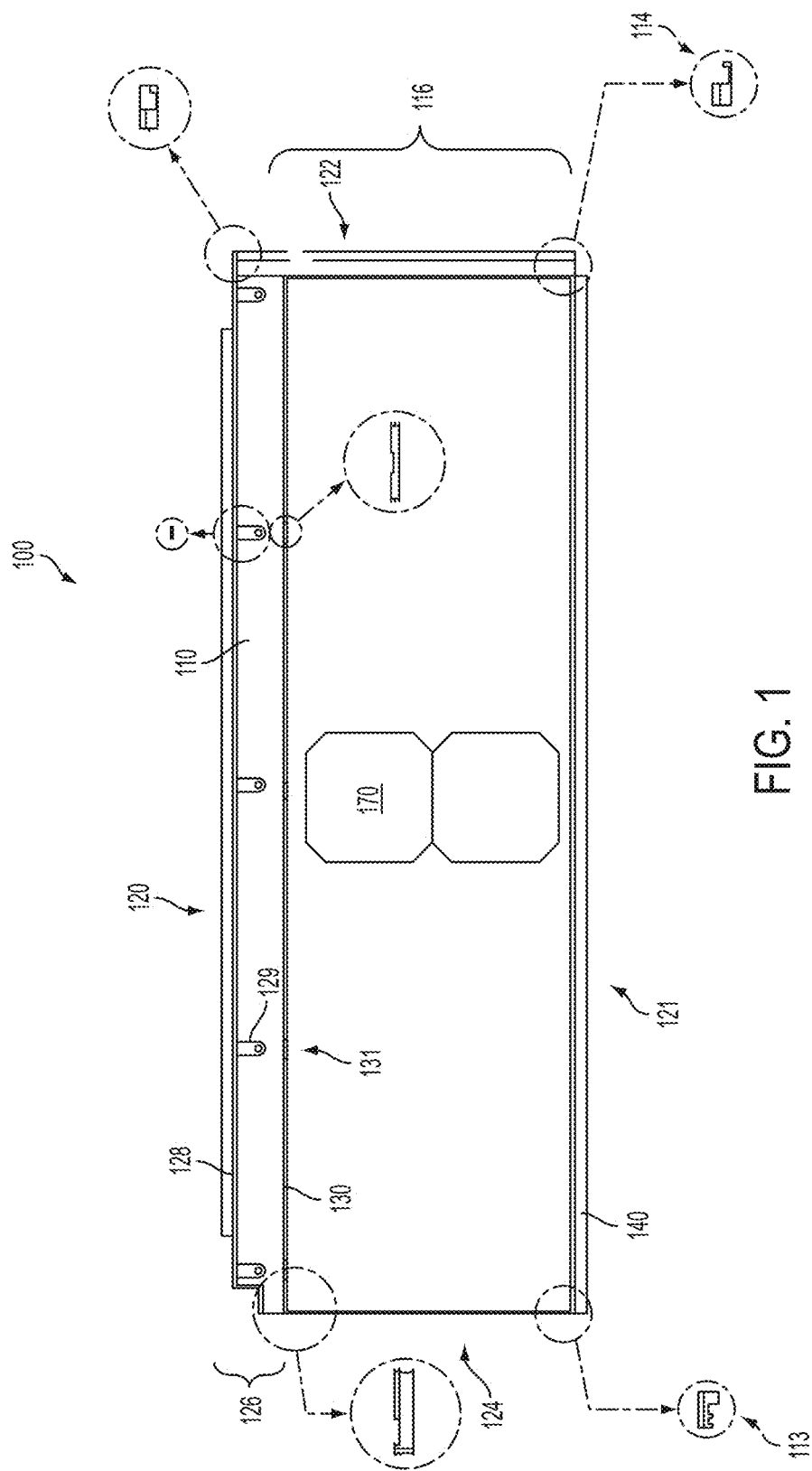
FIG. 1 is a schematic plan view of a photovoltaic roofing element including a frame structure according to one embodiment of the invention.

One aspect of the invention is a photovoltaic roofing element, configured to be disposed on a roof deck having a top end (i.e., toward the ridge of the roof) and a bottom end (i.e., toward the eave of the roof). The photovoltaic roofing element includes a frame structure having an upward-facing surface and a downward-facing surface. The frame structure includes an attachment zone and an exposure zone, with the exposure zone disposed toward the bottom end of the frame structure, and the attachment zone disposed toward the top end of the frame structure. The photovoltaic roofing element further includes one or more photovoltaic elements held in the frame structure.

In certain embodiments, the frame structure includes sidelap portions disposed at its lateral edges and having geometries adapted to interlock with adjacent photovoltaic roofing elements to provide water drainage channels. For example, in one embodiment, the sidelap portion at one lateral edge has an upward-facing water drainage channel; and the sidelap portion at the other lateral edge has a downward-facing flange that fits into the water drainage channel of an adjacent (e.g., identical) photovoltaic roofing element. This configuration is preferred, as it allows a single type of photovoltaic roofing element to be used in an installation. Of course in other embodiments, a single photovoltaic element can have two upward-facing water drainage channels, or two downward-facing flanges in its sidelap portions; as long as such photovoltaic roofing elements are properly mated with the corresponding features on adjacent photovoltaic roofing elements, they can be used to construct a water-tight photovoltaic roofing system.

When installed, any water that moves over the lateral edges of the photovoltaic roofing element will be delivered into the water drainage channel, where it can be delivered down the roof. In certain embodiments, the water drainage channel is open at the bottom edge of the frame structure, such that water can flow out of it and down over the next course of photovoltaic roofing elements.

In certain embodiments, the frame structure includes sidewalls that at least partially define the area in which the one or more photovoltaic elements are held. The sidewalls desirably form a substantially closed polygon, e.g., a rectangle formed by sidewalls on all four sides. The sidewalls, e.g., those on the top sidewall and/or the bottom sidewall, can include drainage channels (formed for example as small discontinuities in the sidewalls) to allow water to drain down the roof. In certain embodiments, the sidewalls substantially enclose the area in which the one or more photovoltaic elements are held; and the one or more photovoltaic elements substantially fill the area defined by the sidewalls. For example, the one or more photovoltaic elements and/or a transparent cover element covering the photovoltaic elements desirably fit within 3 mm, within 2 mm, or even within 1 mm of the sidewalls. The sidewalls are desirably in the range of 2 mm-1 cm in height. In certain embodiments, one or more of the sidewalls do not extend beyond the height of the photovoltaic elements (i.e., in the plane of the one or more photovoltaic elements).

One embodiment of the invention is shown in top view and in various partial cross-sectional views in FIG. 1. The photovoltaic roofing element 100 of FIG. 1 includes a frame structure 110 having an upward-facing surface and a downward-facing surface. When the photovoltaic roofing element is installed on a roof, the downward-facing surface generally faces the roof surface, while the upward-facing surface generally toward the sky.

More specifically, in certain embodiments, and in the embodiment of FIG. 1, the frame structure has a sidelap feature 113 at its left side, and a shiplap feature 114 at its right side, equipped with water dams and drainage paths to minimize water intrusion into the roof. The shiplap feature 114 includes a water drainage channel; and sidelap feature 113 includes a downward-facing flange that is configured to fit in the water drainage channel of the shiplap feature of an adjacent photovoltaic roofing element. As will be described in more detail hereinbelow, such photovoltaic roofing elements can be installed on a roof using flashing having coordinating dam and drainage structures. Photovoltaic roofing elements of this type are described in more detail in U.S. Provisional Patent Application Nos. 61/429,053 and 61/528,631, each of which is hereby incorporated herein by reference in its entirety.

In the embodiment of FIG. 1, the exposure area 116 of the frame structure is equipped with two rows of seven photovoltaic elements 170, each about 5"×5" in dimension. For the sake of clarity, and in order to show the details of the frame structure, only two such photovoltaic elements are shown. The frame structure has a top edge 120, a bottom edge 121, a right edge 122 and a left edge 124. When installed on a roof deck, the top edge is disposed toward the ridge side of the roof deck (i.e., toward its top end), and the bottom edge is disposed toward the eave side of the roof deck (i.e. toward its bottom end). In the embodiment of FIG. 1, near the top end is an attachment zone 126 for fastening the photovoltaic roofing element to a roof structure. A raised lip 128 is provided at the top end of the attachment zone as a dam against water, in order to help prevent moisture intrusion over the upper edge of the photovoltaic roofing element and help to close the roof to the environment. Mounting tabs 129 are provided at several locations across the width of the attachment zone with raised nail bosses, the raised structure providing additional protection from water intrusion through the nail holes. Near the bottom end of the attachment zone is a top sidewall 130, delineating the top edge of the area in which the one or more photovoltaic elements are disposed. Spaced along this top sidewall are drainage openings (e.g., slots or weep holes) 131, such that any water in the attachment zone can drain down the roof over the exposure area 116 of the photovoltaic roofing element.

Figure 1A:
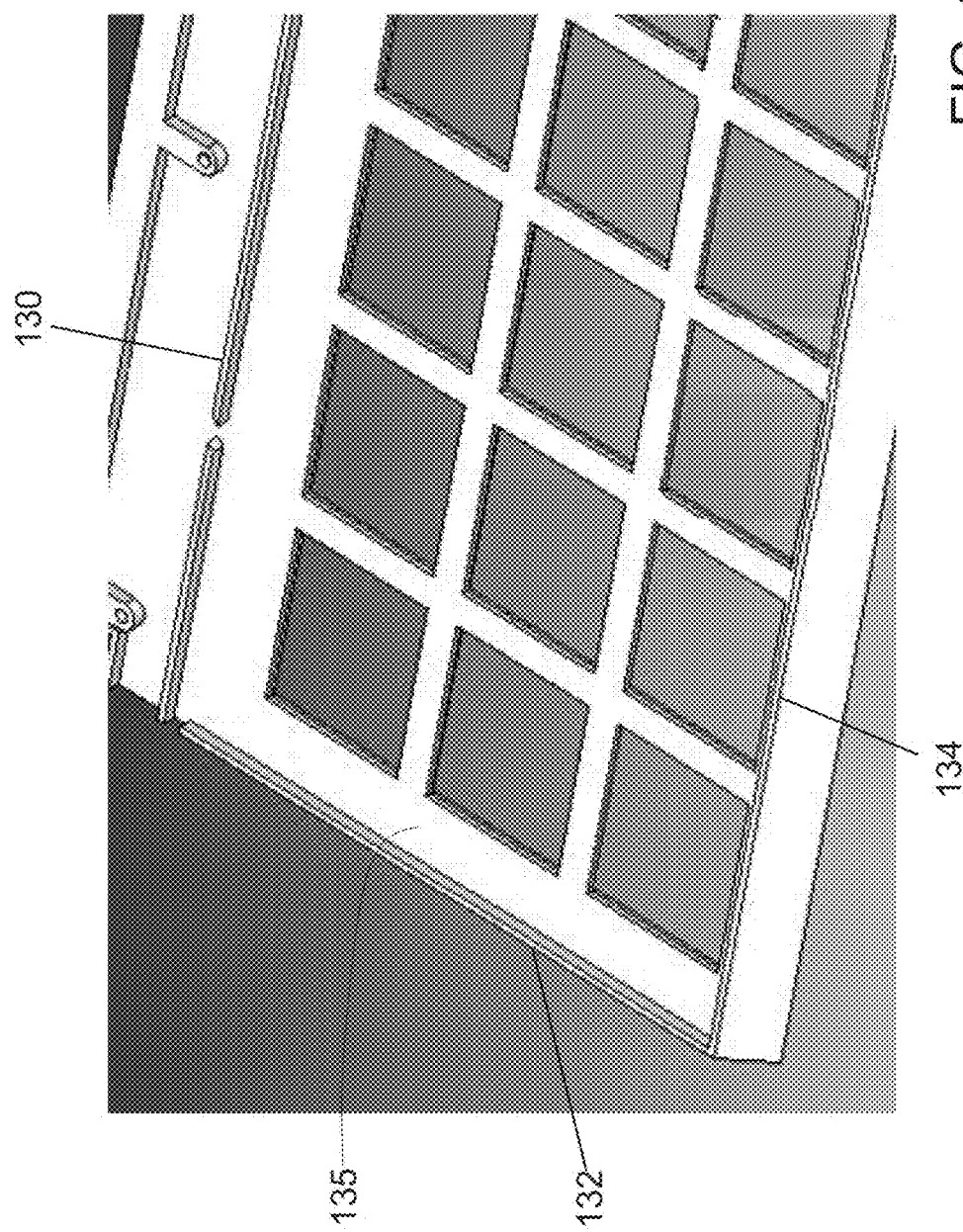
FIG. 1A is a partial schematic perspective view of a frame structure according to one embodiment of the invention.

A top perspective view of a similar frame structure is shown in FIG. 1A. The frame structure of FIG. 1A includes top sidewall 130, as well as sidewalls 132 and 134, defining the left, and bottom edges of the area in which the one or more photovoltaic elements are disposed. In certain embodiments, a similar sidewall is provided at the right edge of the area in which the one or more photovoltaic elements are disposed (i.e. internally adjacent the shiplap feature as described above with respect to FIG. 1). The frame structure is otherwise similar to that described above with respect to FIG. 1. In other embodiments, no sidewall is provided at the right edge; the left-edge sidewall of an adjacent frame structure provides the fourth sidewall defining the area in which the one or more photovoltaic elements are disposed. In certain embodiments, the sidewalls extend above the upward-facing surface 135 of the area in which the one or more photovoltaic elements are disposed by at least about 1 mm, at least about 2 mm, or even by at least about 3 mm. In certain embodiments, however, the sidewalls extend above the upward-facing surface 135 of the area in which the one or more photovoltaic elements are disposed by no more than about 15 mm, no more than about 10 mm, or even by no more than about 8 mm.

Figure 2:
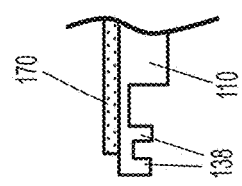
FIGS. 2 and 3 are partial schematic cross-sectional views of a frame structure according to one embodiment of the invention.
Figure 3:
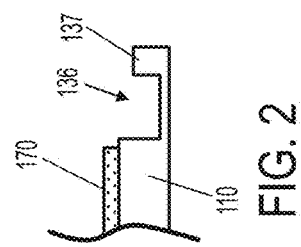

The photovoltaic roofing elements of FIGS. 1 and 1A can be arranged in an array, with laterally adjacent photovoltaic roofing elements being engaged with one another in a shiplap manner. The photovoltaic roofing element has on one side edge (in FIG. 1, the right-hand edge) an upward-facing water drainage channel. FIG. 2 is a cross-sectional view of the photovoltaic roofing element of FIG. 1 in its exposure zone at its right hand edge, in which the frame structure 110, photovoltaic element 170, and upward-facing channel 136 is visible. An outer flange 137 defines the upward-facing water drainage channel. The upward-facing water drainage channel is preferably open at the bottom edge of the photovoltaic roofing element, such that any water entering the gap between adjacent photovoltaic roofing elements is collected therein and conducted down the roof. As shown in FIG. 2, the upward-facing channel is at a lower elevation with respect to the attachment zone. The photovoltaic roofing element has on its opposite side edge (in FIG. 1, the left-hand edge) a downward-facing flange (e.g., a ridge), configured such that the downward-facing flange of one photovoltaic roofing element can engage the upward-facing channel of an adjacent photovoltaic roofing element. FIG. 3 is a cross-sectional view of the photovoltaic roofing element of FIG. 1 in its exposure zone at its left-hand edge, in which two downward-facing flanges 138 are visible. These downward-facing flanges are configured to fit in the upward-facing water drainage channel of an adjacent photovoltaic roofing element.

In certain embodiments, and as shown at the lower edge of the photovoltaic roofing element of FIG. 1, a leading edge extension 140 is provided to cover an upper portion of a photovoltaic roofing element of an underlying course of photovoltaic roofing elements. When installed in an array, the leading edge extension 140 can extend substantially to the exposure zone of an underlying course of photovoltaic roofing elements, to improve conduction of water down the roof. In certain embodiments, the leading edge extension does not span the entire length of the frame structure; for example, as shown in FIG. 1, it can be missing in one of the sidelap portions, such that the leading edge extensions of adjacent photovoltaic roofing elements do not interfere with one another. In certain embodiments, the leading edge extension includes a recess on its downward-facing surface, to accommodate the raised lip 128 at the top end of the attachment zone of an overlying photovoltaic roofing element, thereby forming part of the water barrier system between the panels. In use, the leading edge extension can be covered by the one or more photovoltaic elements; it need not be a visually distinct feature. Of course, in other embodiments, the sidelap and shiplap features can extend the entire height of the frame structure, so that the entire height of the side edges of adjacent elements interlock to one another.

Figure 4:
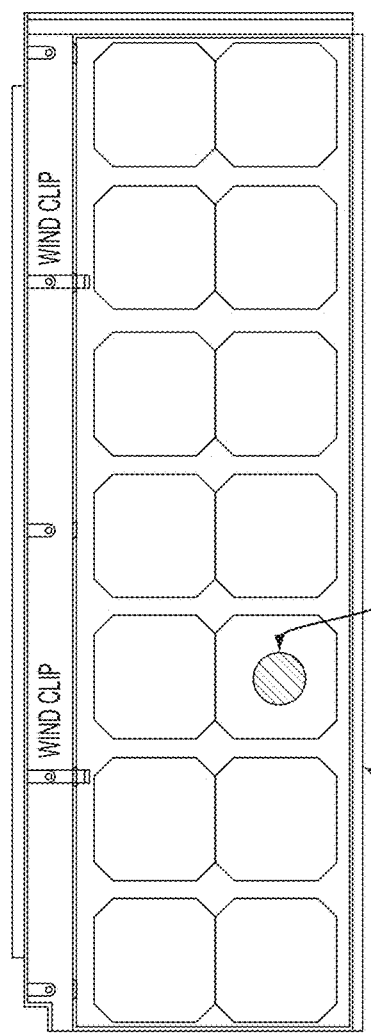
FIG. 4 is a schematic plan view of a photovoltaic roofing element including a frame structure according to one embodiment of the invention.

FIG. 4 is another top schematic view of the photovoltaic roofing element of FIGS. 1 and 1A with a rigid photovoltaic element (e.g., a module including the two rows of seven photovoltaic cells as described above, with a tempered glass top cover to protect the cells). Cells are laterally spaced at intervals of about ¾ inch. The cells are inset from the top and bottom edges of the module by about ½ inch and from the left and right side edges by about ⅜ inch. Preferably, the cells of the module are inset from the edges of the module sufficiently to conform to UL, NEC or other electrical code requirements. The module is set into the panel in the area formed by the sidewalls and sealed in place with an appropriate sealant, e.g., as a perimeter ridge surrounding the module. The photovoltaic element (here, the module as defined by its tempered glass cover) will preferably be within 3 mm, within 2 mm, or even within 1 mm of the sidewalls. Preferably, the ridge running along the top edge of the module provides a raised lip at the lower edge of the attachment zone and has drainage openings as described above to provide drainage over the top surface of the module in the exposed area of the photovoltaic roofing element.

In FIG. 4, the bottom edge of the photovoltaic roofing element is formed by the leading edge extension, but as described above, in some embodiments, no leading edge extension is at the bottom edge of the photovoltaic roofing element. In either event, an indicator line is shown in FIG. 4 about ½ inch below the ridge at the bottom end of the attachment zone to suggest where the bottom edge of an overlying photovoltaic roofing element would lie in the installed condition. The bottom edge of the overlying photovoltaic roofing element preferably covers the horizontal-running seam where the photovoltaic element is disposed in the frame structure (i.e., along the top sidewall). Wind clips (as will be later discussed with reference to FIG. 9) are shown to be attached using two of the nail boss fastening zones using the same fasteners to mount the panel to a roof structure; the wind clips can hold down the bottom edge of the overlying photovoltaic roofing element. In this embodiment, the drainage holes in the lower lip of the attachment zone are aligned with the nail bosses so that the wind clips pass through the drainage holes and provide an upward directed hook or clip to assist in securing an overlying course of photovoltaic roofing elements to the already installed lower course.

FIG. 5 is a partial schematic side view of a frame structure 510 suitable for use in certain embodiments of the invention. A leading edge extension 540 at the bottom side of the photovoltaic roofing element is at the left edge of the diagram; and the attachment zone 526 at the top side is at the right. The framing structure includes a downward-facing channel 550 that can act as a wiring containment structure. In certain embodiments, and as shown in FIG. 5, a ridge 541 is formed on the downward-facing surface of the framing structure 510 toward its bottom end. The ridge 541 is adapted to fit into a corresponding channel 542 formed in the upward facing surface of an underlying panel, at the interface between the attachment zone and the exposure zone. The interlocking of the ridge 541 into the channel 542 can provide additional water resistance to an array of photovoltaic roofing elements by providing a circuitous path for water, thereby preventing intrusion of water and wind-driven rain to the roof deck. The downward-facing surface of framing structure of FIG. 5 also includes a wiring containment channel 550, into which wiring can fit, so that the framing structure does not pinch it against the roof. Top and bottom sidewalls are not shown in the embodiment of FIG. 5, but could be included as the person of skill in the art would realize in view of the present disclosure.

FIG. 6 is a top schematic view of the headlap portion and attachment zone of an example of a photovoltaic roofing element, with emphasis on a number of optional features that can help prevent water ingress. The raised fastener locations can minimize water leakage around the nail or screw used to attach the photovoltaic roofing element to a roof. The top sidewall (i.e., the "water barrier ledge" in the figure) acts as a wall or dam to minimize infiltration of wind driven rain. The ledge in this case also serves to define the location of edge of the exposure area and, in certain instances, can cooperatively interact with an overlying photovoltaic roofing element to ensure proper location of the next course (e.g., as described above with respect to FIG. 5). The drainage slots in the water barrier ledge are angled to prevent water being blown up into the attachment zone, while providing an exit path for water that may enter the attachment zone. Water exiting through the drainage slots or weep holes would proceed down the roof over the top of the exposure area of the photovoltaic roofing element. In certain embodiments, at least one lateral side edge of the attachment zone does not include a sidewall, such that water in the attachment zone can flow off of the side thereof (e.g., into a channel formed by a shiplap feature as descried above). In other embodiments, a lateral side edge sidewall includes drainage channels to allow water to drain off the side of the photovoltaic element. In the embodiment shown in FIG. 6, the lateral sides of the attachment zone are not dammed off, such that any water that does make it into the attachment zone can to drain into the photovoltaic roofing element's shiplap drainage channels. Water exiting to the right side of the photovoltaic roofing element shown would directly enter its own drainage channel. Water exiting to the left side would enter the drainage channel of the left adjacent photovoltaic roofing element. In certain embodiments, similar drainage can be achieved if the sidewalls do not extend beyond the top surface of the photovoltaic element.

Figure 7:
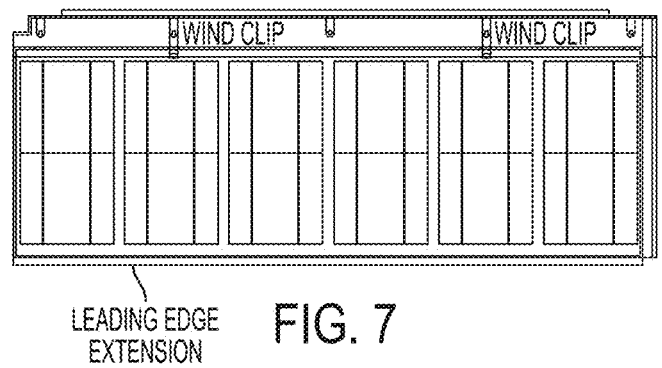
FIG. 7 is a schematic plan view of a photovoltaic roofing element according to one embodiment of the invention.

FIG. 7 shows a top plan view of a photovoltaic roofing element similar to those of FIGS. 1, 1A and 2, but where the size and shape of the exposure zone has been adjusted to accommodate a photovoltaic module having two rows of six inch photovoltaic cells. The configuration of FIG. 7 has a greater surface area of active photovoltaic media than that of FIGS. 1, 1A and 2. Of course, the person of skill in the art will appreciate that a variety of configurations and spacings of photovoltaic cells and modules can be used in practicing certain aspects of the present invention. Moreover, the person of skill in the art will appreciate that a wide variety of photovoltaic cells and modules can be used in practicing the present invention. The embodiments of FIGS. 1, 2 and 7 are described as using rigid photovoltaic elements. In other embodiments according to certain aspects of the invention, the photovoltaic elements are flexible photovoltaic elements, for example, the encapsulated flexible photovoltaic elements available from Uni-Solar.

Figure 8:
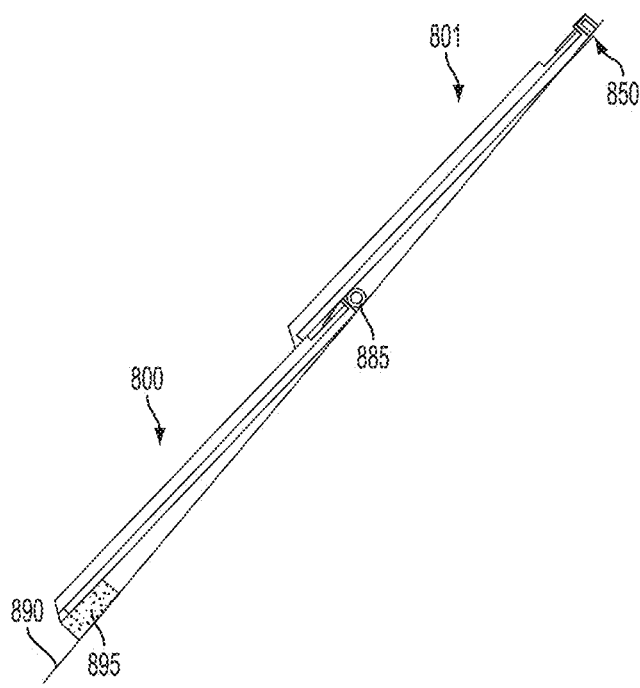
FIG. 8 is a partial schematic cross-sectional view of two courses of photovoltaic roofing elements according to one embodiment of the invention.

FIG. 8 shows a side edge view of a pair of roofing panels with a second photovoltaic roofing element 801 overlying a first photovoltaic roofing element 800, disposed on a roof deck 890. An electrical connector 885 (e.g., of the MC-4 type) is shown at the top of the first panel, its wiring contained in the wiring containment channel 850 at the top of the panel (not visible in the first photovoltaic roofing element, but visible in the second photovoltaic roofing element; see also FIG. 5). The thickness of the photovoltaic roofing element is sufficient to contain the connector beneath the panel above the roof surface. Also, in this view, the first course has a cant strip or starter block 895 underlying the leading edge on the down roof side of the panel. The cant strip raises the leading edge of the first course so that photovoltaic roofing elements of the first course are angularly oriented similarly to those of the overlying courses.

Figure 9:
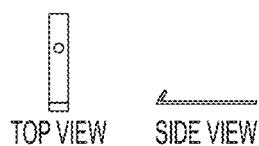
FIG. 9 is a pair of schematic views of a wind clip suitable for use with certain embodiments of the invention.

FIG. 9 shows a top view and a side view of a wind clip leading edge retainer for use with photovoltaic roofing elements according to certain embodiments of the invention. The wind clip can be mounted onto a selected nail boss of the attachment zone of a photovoltaic roofing element, passing through a drainage slot, and providing an upward directed hook to secure the leading edge of an overlying photovoltaic roofing element. In one embodiment, the wind clips extend around to outside of the leading edge of the overlying photovoltaic roofing element, remaining visible in use. In another embodiment, the overlying photovoltaic roofing element (e.g., in its leading edge extension) is provided with a slot at its bottom edge to accommodate passage of the wind clip therethrough. In another embodiment, the wind clips engage with a recess in the downward facing surface of the photovoltaic roofing element (e.g., in its leading edge extension) and are hidden from view. A preferred material for the wind clip is a metal such as aluminum of about 40 mil thickness. In the case where the clip hooks under the leading edge extension, preferably the angle of the bend in the clip substantially matches the exterior angle of the bottom edge of the overlying photovoltaic roofing element. For a wind clip that engages a feature in the downward-facing surface of an overlying photovoltaic roofing element, the angle preferably substantially matches the geometry of the recess. For visible wind clips of aluminum, preferably the clip is colored either by coating, or alternatively by anodizing, to a color to be complementary to the framing structure of the photovoltaic roofing panel. Alternatively, wind clips could be made from polymeric or plastic materials. In some embodiments, selected wind clips can include platforms that act as snow guards to break up sliding snowfalls from the roof.

As described above with respect to FIG. 1A, in certain embodiments, the exposure zone includes raised sidewalls that define the area in which the photovoltaic elements are disposed. The area of the frame in which the one or more photovoltaic elements are disposed includes an upward-facing base surface 135, forming the base on which the photovoltaic elements are disposed, and the sidewalls extend above the upward-facing surface 135 by at least about 2 mm, or even by at least about 3 mm. Advantageously, the sidewalls can enable an adhesive used to adhere the photovoltaic element to the frame to encapsulate part of the edge of the photovoltaic element, thus sealing and protecting it and reducing potential susceptibility to moisture intrusion.

Figure 10A:
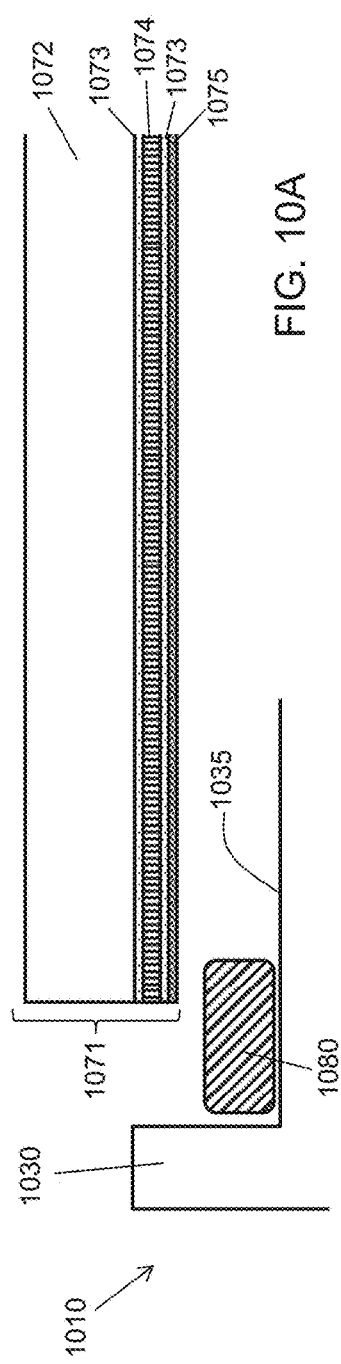
FIGS. 10A and 10B are partial cross-sectional partial schematic views of the installation of a photovoltaic element in a frame structure according to one embodiment of the invention.
Figure 10B:
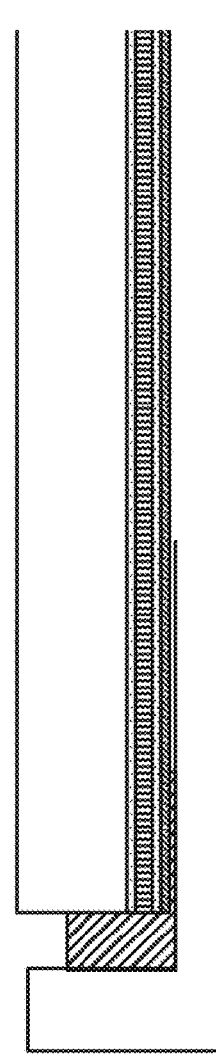
Figure 10C:
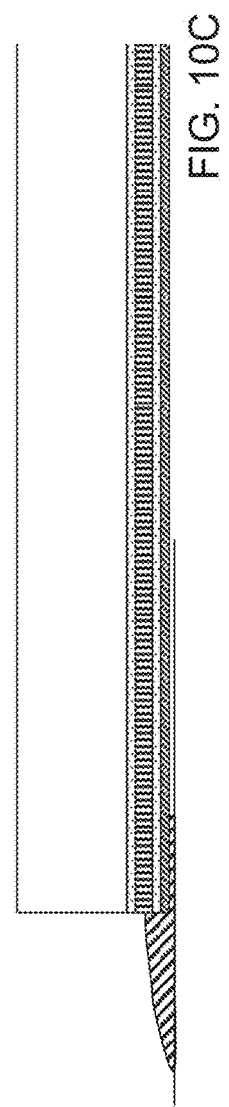
FIG. 10C is a partial cross-sectional schematic view of a comparative example.

An example of this effect is shown in partial cross-sectional schematic view in FIGS. 10A and 10B. In FIG. 10A, frame structure 1010 includes a sidewall 1030 at its edge, which extends from the base surface 1035. A bead of adhesive sealant 1080 has been applied inside the sidewall, and a photovoltaic element 1071 is provided ready to be assembled to the frame to produce a photovoltaic roofing element. In this embodiment, the photovoltaic element is in the form of a laminate (i.e., shown as a plurality of layers, including a layer of photovoltaic cells 1074 encapsulated by polymer films 1073 (e.g., EVA films) to a back sheet 1075 and a transparent cover (e.g., glass) 1072). In FIG. 10B, the photovoltaic element has been disposed on the frame inside the sidewall. The bead of adhesive is squeezed to flow, filling the space between the frame surface and the laminate, making contact with both so as to bond the laminate to the frame. In FIG. 10B, the flow of the adhesive around the corner edge of the photovoltaic element proceeds up its side edge, but is contained in its flow by the sidewall of the frame structure. This can be contrasted with the situation shown in FIG. 10C; in the absence of sidewalls, the adhesive can flow laterally away from the photovoltaic element, and insufficiently seal in the edge of the photovoltaic element. As shown in FIG. 10C, without a sidewall, the edge interfaces of the photovoltaic laminate structure can remain unencapsulated, thus leaving them susceptible to moisture intrusion and possible detrimental effects on performance of the module over time when exposed to weather and the environment.

In certain embodiments, the height of one or more of the sidewalls is such that, when the photovoltaic element is installed, it is somewhat lower (i.e., in the plane of the photovoltaic element) than the top surface of the photovoltaic element in at least some portions. This is illustrated in FIG. 10B, in which the sidewall is slightly lower than the top surface of the sidewall, such that water can drain down the roof from the top surface of the photovoltaic element. For example, in certain embodiments, the sidewall at the bottom edge of the frame structure is lower than the top surface of the photovoltaic element. In other embodiments, the sidewalls at the bottom edge and one or more of the side edges are lower than the top surface of the photovoltaic element. For example, in certain such embodiments, the sidewalls are lower than the top surface of the photovoltaic element by an amount in the range of about 0.1 mm to about 5 mm, or in the range of about 0.25 mm to about 2 mm.

In certain embodiments, the base surface of the area on which the photovoltaic element is disposed includes one or more raised structures, on which the photovoltaic element rests. Thus, in such embodiments, there remains a fixed space between the downward-facing surface of the photovoltaic element and the upward-facing surface of the base of the frame, such that an adhesive layer of a controlled thickness can be formed.

An example of such a frame structure is shown in perspective schematic view in FIG. 11. In the embodiment of FIG. 11, frame structure 1110 includes sidewalls 1130, which enclose the area in which a photovoltaic element is to be disposed, which area includes base surface 1135. Extending upwards from the base surface are raised structures 1137. Desirably, the raised structures are formed on less than about half of the base surface. In this embodiment, the base surface also has a hole or depression 1138 formed therein, through which fasteners can affix the frame structure to a roof surface. The raised structures can position the photovoltaic element at a selected height above the base surface of the frame structure, thereby providing a reproducible thickness or volume of sealant or adhesive beneath the perimeter of the photovoltaic element. It can also allow space for adhesive to flow upward at the edge of the photovoltaic element to help ensure the sealing of the photovoltaic element at the sidewall. In embodiments in which no raised structures are provided (see, e.g., FIG. 10B), care should be taken to ensure that an appropriate amount of adhesive is used uniformly around the frame and that the photovoltaic element is placed with uniform even pressure so that adhesive can bond the photovoltaic element to the frame, sealing the panel, and avoiding uneven squeezing of the adhesive. If the pressure or adhesive amounts are not adequately controlled, some portions of the perimeter may have insufficient sealant, and/or the photovoltaic element may become misaligned in the frame structure during assembly. The use of raised structures can thus simplify the assembly process. The use of raised structures can also help with repeatability of the assembly process, ensuring that all photovoltaic elements protrude substantially the same amount from the frame structure.

The use of a raised structure is illustrated in cross-sectional schematic view in FIG. 12. The photovoltaic element 1271 is disposed on the frame structure 1210 inside the sidewall 1230. When the bead of adhesive 1280 is squeezed to flow, the photovoltaic element rests on the raised structures 1237, spaced from the base surface 1235. The adhesive fills the space between the base surface and the photovoltaic element, making contact with both so as to bond the laminate to the frame as described above with reference to FIG. 10B. As noted briefly above, the raised structures provides a gap between the downward-facing surface of the photovoltaic element and the base surface of the frame structure along the perimeter, and the sidewall contains the adhesive and helps its flow direction to seal the edge of the photovoltaic element.

The height of the one or more raised structures can be selected to provide for an appropriate volume of adhesive between the photovoltaic element and the frame structure. In some embodiments, the one or more raised structures are greater than about 10 mils in height, greater than about 20 mils in height, greater than about 30 mils in height, greater than about 40 mils in height, or greater than about 50 mils in height. In one particular embodiment, the height dimension of the raised structure is about 40 mils. In certain embodiments, the one or more raised structures are less than about 200 mils in height, less than about 150 mils in height, or less about 100 mils in height.

In the embodiment of FIG. 12, the raised structures are formed as a discontinuous series of features (here, pedestals). In other embodiments, the raised structures are formed as one or more continuous (or substantially continuous)

ridges. For example, in the embodiment of FIG. 13, a frame structure has raised ridges 1337 along the perimeter of the area in which the photovoltaic element is to be disposed. In this embodiment, additional raised structures (in the form of ridges 1339) are disposed along the interior of the area in which the photovoltaic element is to be disposed (here, along the support ribs) in order to support the photovoltaic element in the event of surface loading. When a photovoltaic element is to be installed, a sealant or adhesive can be applied along the perimeter of the area in which the photovoltaic element is to be disposed, inside the sidewalls and outside the raised structures. The raised structures can thus form a channel or moat into which adhesive can be disposed. As described above, when the photovoltaic element is disposed within the frame, it rests on the raised ridge structures, squeezing a portion of the adhesive or sealant so that it flows upwardly at the edges and is contained by the sidewalls of the frame structure.

Figure 14:
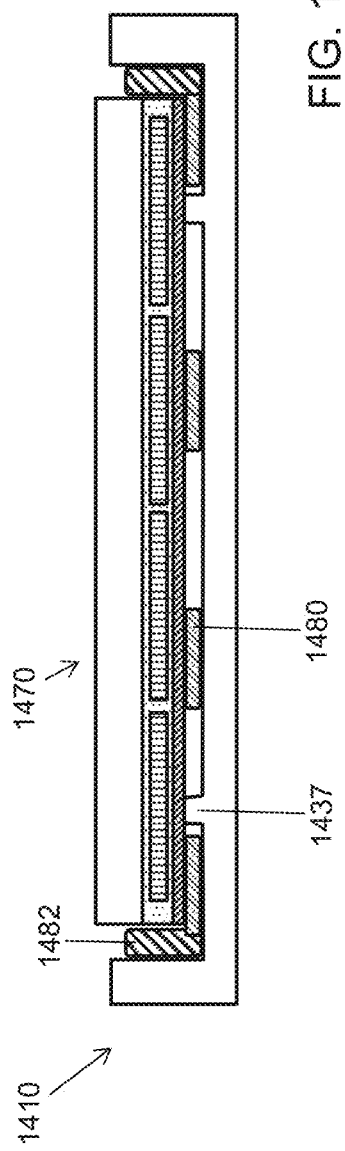
FIG. 14 is a cross-sectional schematic view of a photovoltaic roofing element according to one embodiment of the invention.

FIG. 14 shows a side cross sectional schematic view of an embodiment of a photovoltaic roofing element as assembled. A frame structure 1410 (formed from polymer) holds a photovoltaic element 1470 in laminate form. The laminate structure includes crystalline silicon-based photovoltaic cells encapsulated by an ethylene vinyl acetate (EVA)-based adhesive and protected with a glass cover sheet and a polymeric back sheet, as more generally described above with reference to FIG. 10A. A raised structure 1437 supports the module a set distance from the frame structure. An adhesive 1480 fills the gap in selected areas between the module and the frame. One adhesive that can be utilized is known as adhesive 804 Dow Flexible Adhesive provided by the Dow Chemical Company of Midland, Mich. In certain embodiments of the invention, and as shown in FIG. 14, a second adhesive or caulking material 1482 is included for sealing the edge of the photovoltaic laminate assembly in the frame. The second material 1482 may be different from or the same as the first adhesive. In particular, moisture cure or two component cure systems can be useful for sealing the edges of the photovoltaic element.

Figure 15:
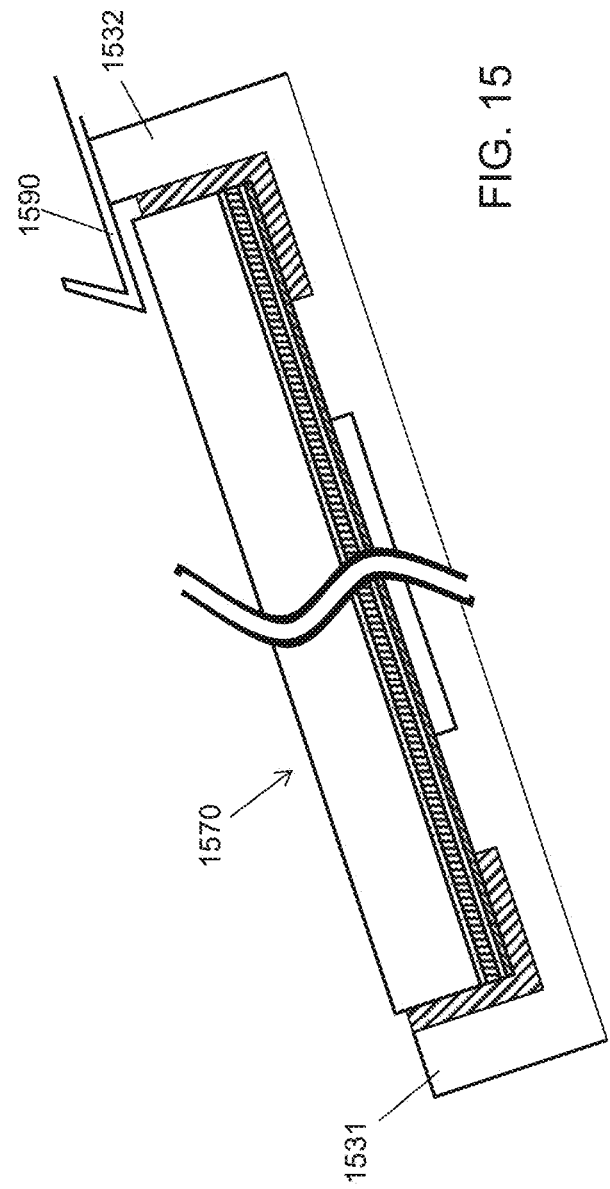
FIG. 15 is perspective schematic view of a frame structure suitable for use in certain embodiments of the invention.

As noted above, in certain embodiments, the height of one or more of the sidewalls is such that, when the photovoltaic element is installed, it is somewhat lower than the top surface of the photovoltaic element in at least some portions. In certain such embodiments, the sidewall adjacent the top edge of the frame structure has a height such that, when the photovoltaic element is installed, it is somewhat higher (i.e., in the plane of the photovoltaic element) than the top surface of the photovoltaic element, at least in some portions. Such an embodiment is shown in cross-sectional schematic view (i.e., looking across the roof surface) in FIG. 15. In FIG. 15, bottom edge sidewall 1531 is lower than the upward-facing surface of the photovoltaic element 1570; while the top edge sidewall 1532 is higher than the upward-facing surface of the photovoltaic element 1570. Notably, a wind clip 1590 sits on the top edge sidewall 1532, and does not contact the top surface of the photovoltaic element, thus minimizing damage to the photovoltaic element (e.g., via scratching resulting from movement of the wind clip relative to the photovoltaic element due to wind).

As noted above, in certain embodiments of the invention, the raised structures are discontinuous. Accordingly, in use, adhesive is not confined within a "moat" formed by the raised structure, and can flow through the discontinuities to adhere the photovoltaic element to the frame structure in more internal areas. FIG. 16 is a cross-sectional/perspective partial schematic view of a frame structure having a discontinuous raised structure. When a photovoltaic element is installed into this frame structure with an adhesive as described above, the adhesive flows not only up the sidewall, but also through the discontinuity to occupy additional space between the frame and the laminate, internal relative to the raised structures. The dashed line shows an example of the extent of adhesive flow. Accordingly, a discontinuous set of raised structures can provide greater surface area of bonding between the photovoltaic element and the frame structure.

In certain embodiments, a raised structure is positioned in contact with a sidewall. One such embodiment is shown in partial cross-sectional schematic view in FIGS. 17A and 17B. In FIG. 17A, a bead of adhesive 1780 is applied on the raised structure 1737, which is disposed in contact with the sidewall 1731. Photovoltaic element 1770 is positioned over the frame structure, ready to be pushed down onto the adhesive. In FIG. 17B, the photovoltaic element has been pushed onto the raised structure, and the adhesive flows into the space between the edge of the photovoltaic element and the sidewall and the area inside the raised structure to bond the parts to one another.

FIGS. 18A, 18B and 18C are partial schematic end views (with cross-sectional detail in dashed line) of photovoltaic roofing elements according to various embodiments of the invention. The bottom end of each is on the left of each figure; and the top end is on the right. Attachment zones are not shown in these figures. In all of FIGS. 18A, 18B and 18C, the bottom edge sidewall is slightly lower than the top surface of the photovoltaic element (i.e., in the plane of the photovoltaic element). In FIG. 18A, the right edge sidewall (i.e., disposed to the front) tapers from top edge to bottom edge so that at least portions of the edge sidewall are lower than the top surface of the photovoltaic element when installed in the frame structure. Having the bottom and edge sidewalls lower than the top surface of the photovoltaic element allows for drainage of water off of the photovoltaic roofing element in use. In FIG. 18B, the right edge sidewall is the same height as the bottom edge sidewall with a distinct transition in height near the top end of the part of the frame structure containing the photovoltaic element. In FIG. 18C, there is a smooth transition in right edge sidewall height near its top end.

Figure 19:
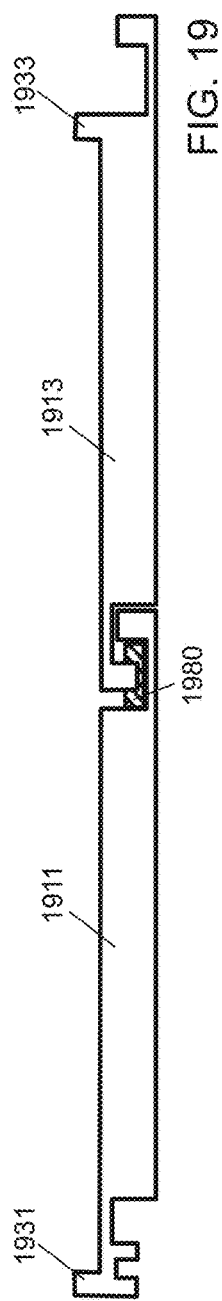
FIG. 19 is a cross-sectional schematic view of a frame structure constructed from two pieces according to one embodiment of the invention.

In certain embodiments, the frame structure is formed from a plurality of horizontally-adjacent pieces. The frame structure can, for example, be assembled from separate pieces on the roof, with the separate pieces on the roof together providing the sidewalls forming a substantially closed polygon. Such a frame structure can be assembled with a single photovoltaic element covering both pieces of the frame structure. The pieces can be joined with an expansion joint in their area of overlap, the expansion joint designed to offset differences in thermal expansion between the frame structure and the photovoltaic element (e.g., especially when the photovoltaic element is formed with a glass protective sheet). The expansion joint can be formed, for example, by shiplap features that have play in them, such that the two horizontally adjacent pieces can move somewhat with respect to one another. An example is shown in cross-sectional schematic view in FIG. 19. Frame pieces 1913 and 1915 interlock to form a single frame structure that is configured to hold a photovoltaic element within sidewalls 1931 and 1932. The shiplap features do not fit tightly, but rather leave some room for the pieces to shift horizontally. In the embodiment of FIG. 19, a flexible sealant 1980 seals the pieces to one another while allowing them to move with respect to one another to accommodate expansion or contraction differences due to temperature.

Figure 20:
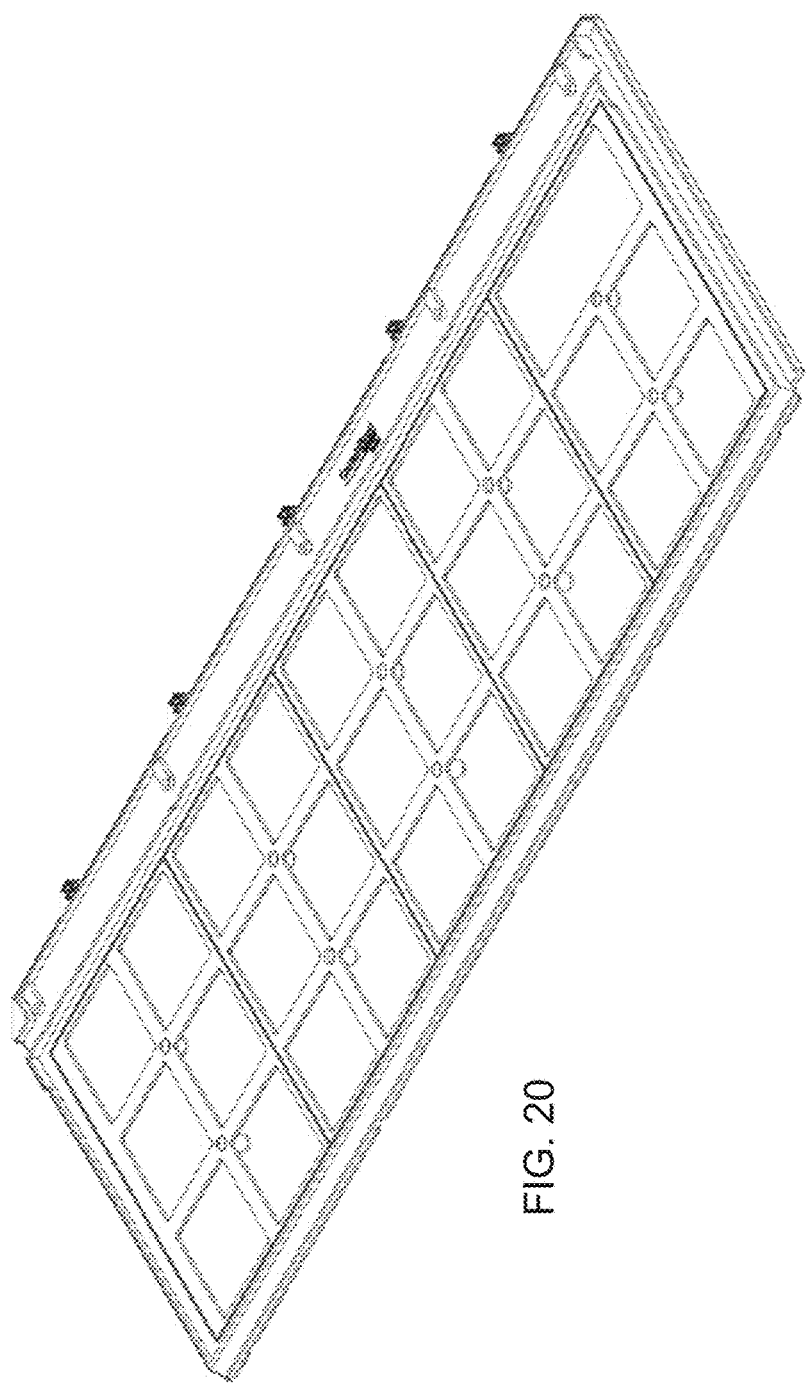
FIGS. 20-23 are various views of an example of a photovoltaic roofing element according to one embodiment of the invention.

FIG. 20 is a perspective view of a frame structure for a photovoltaic roofing element. The area for receiving a photovoltaic element has a ribbed structure to provide strength to the geometry of the frame. A sidewall is provided at the bottom, top, and each side edge of the area for the photovoltaic element. A raised structure is provided inside the sidewalls, creating a moat for receiving and guiding the flow of a sealing adhesive used to bond a photovoltaic element to the frame structure; and for providing support to the photovoltaic element. The raised structure is also present on a portion of the ribbed structures in the central part of the frame structure to aid in minimizing flexure of the photovoltaic element in an assembly. The top portion of the frame structure includes an attachment zone with protruding nail bosses for fastening the shingle to a roof. Recesses are provided in the top edge sidewall to accommodate wind clips that may be attached with fasteners through the nail bosses. Additional recesses are provided in the lower lip of the leading bottom edge of the frame structure to accommodate wind clips attached to a next lower course of photovoltaic roofing elements on a roof. Wire retaining features are provided at the upper edge of the frame above the fastening zone. Right and left sides of the frame structure include ship lap interlocking features to close laterally adjacent photovoltaic roofing elements between shingles in an array and direct water down the roof, as described herein.

Figure 21:
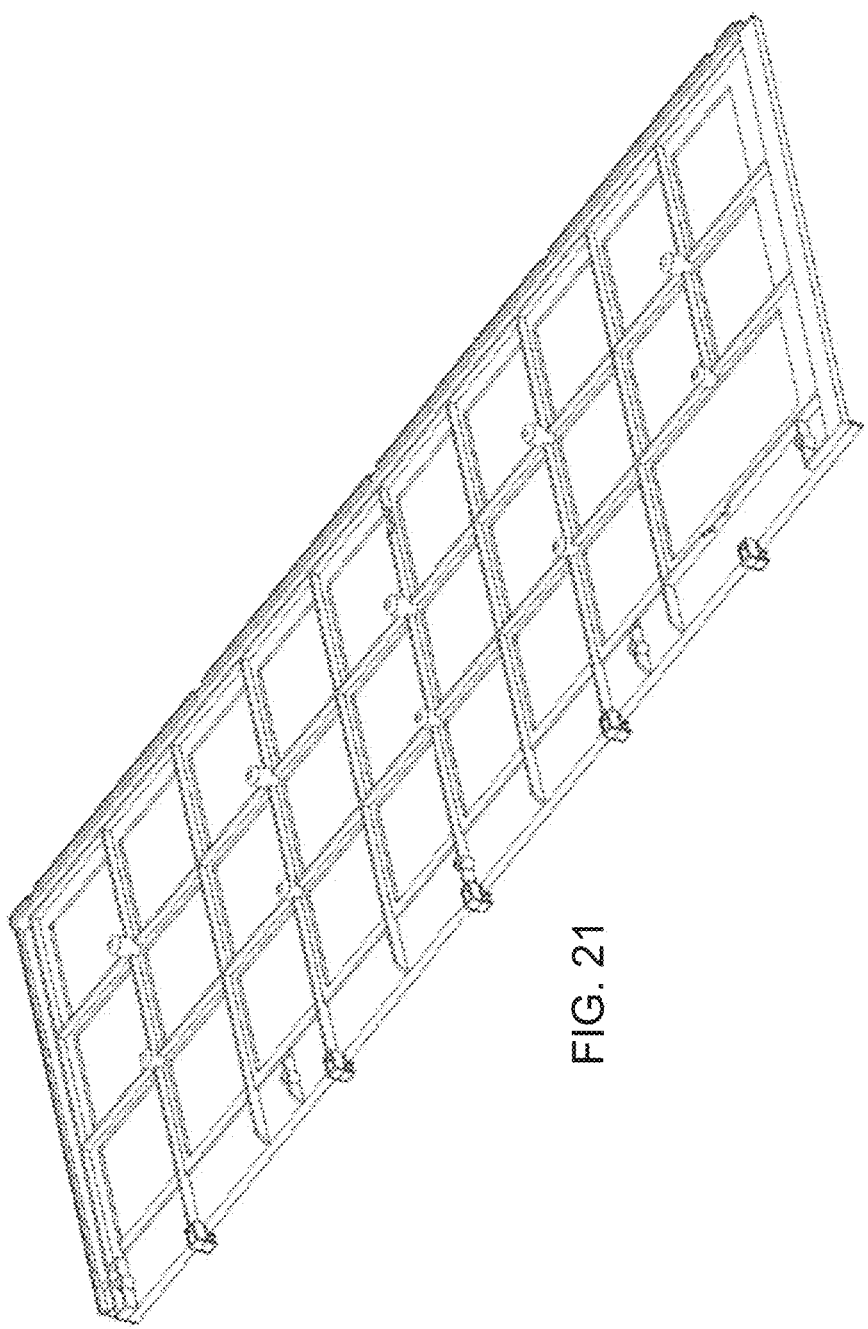

FIG. 21 is a bottom view of the frame structure of FIG. 20. Distributed across the underside of the frame are support legs (in a "bullnose" shape in this embodiment) to bring the frame structure into contact with the roof deck as photovoltaic roofing elements are laid in an overlapping fashion in an array. The legs closer to the bottom edge of the photovoltaic roofing array are taller than the legs closer to the top edge. The bottom edge does not have the legs, as it is intended to rest atop the fastening zone of a photovoltaic roofing element in the next lowermost course or a cant strip or starter strip. The legs maintain a space beneath the shingle to aid in wire management.

Figure 22:
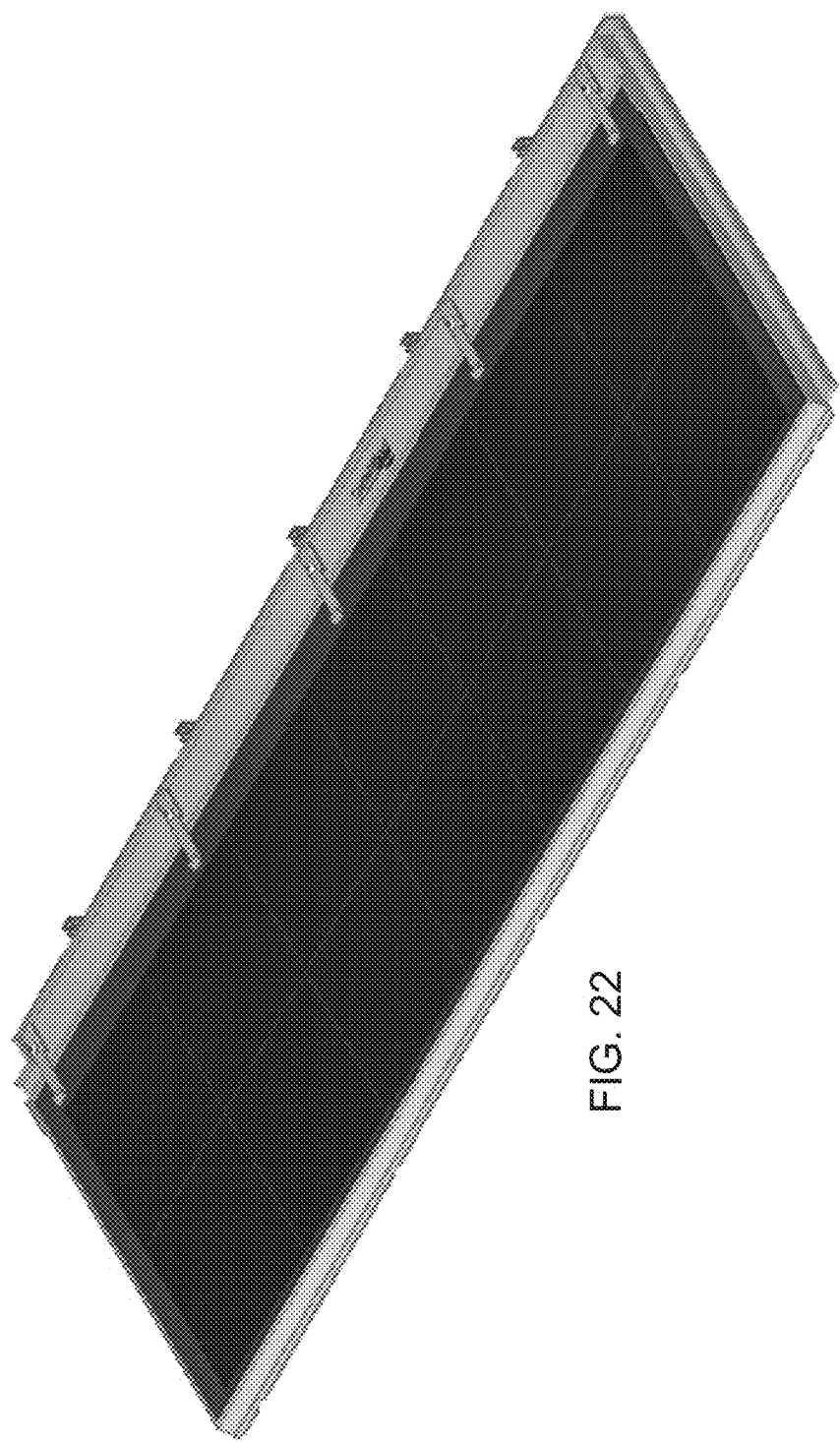
Figure 23:
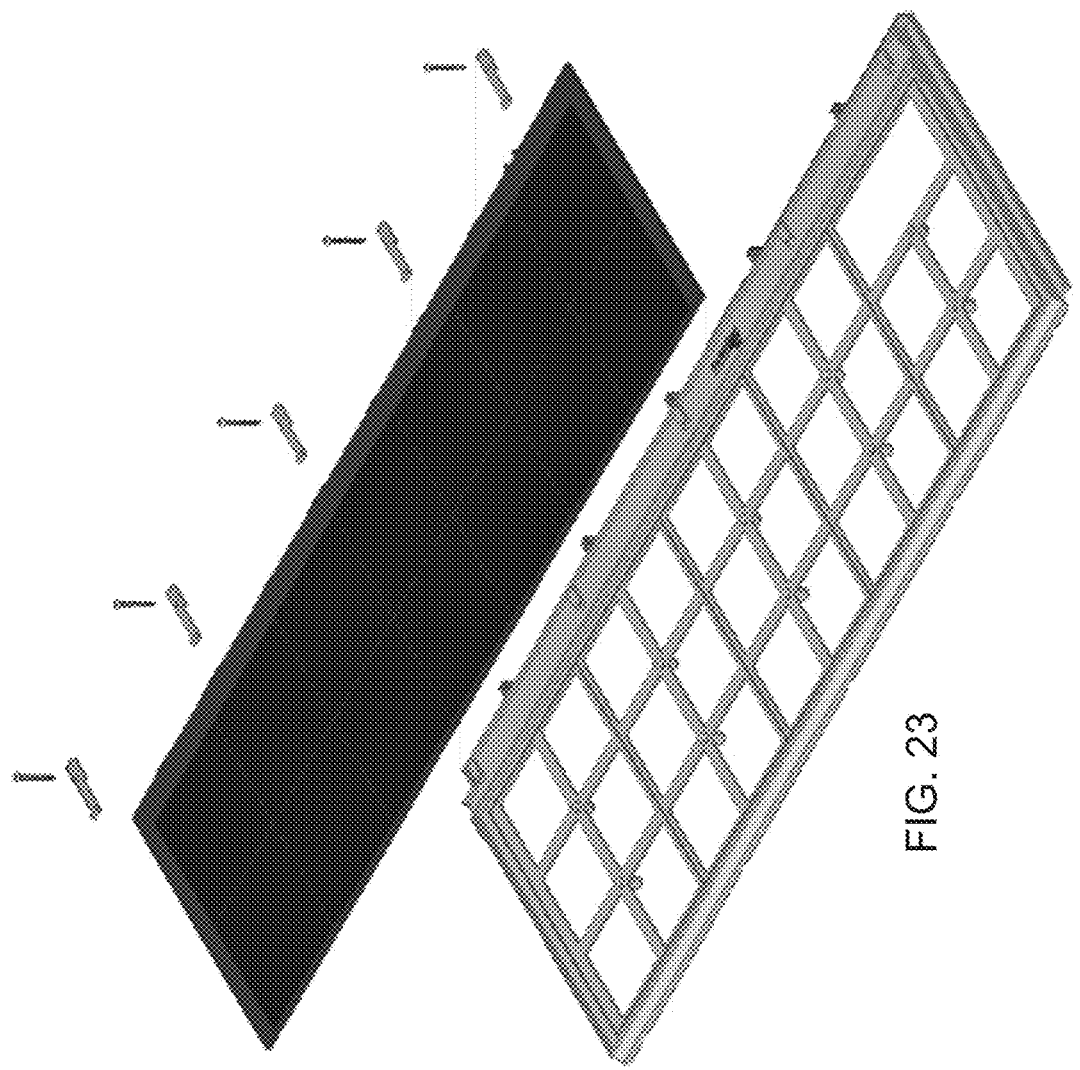

FIG. 22 is a perspective view of an assembled photovoltaic roofing element including a frame structure as described in FIG. 20. The photovoltaic roofing element in this embodiment includes the frame, a photovoltaic laminate, fasteners and wind clips. FIG. 23 is an exploded isometric view of the photovoltaic roofing element of FIG. 22, showing the frame structure, the photovoltaic element, wind clips and fasteners in a separated fashion.

Figure 24B:
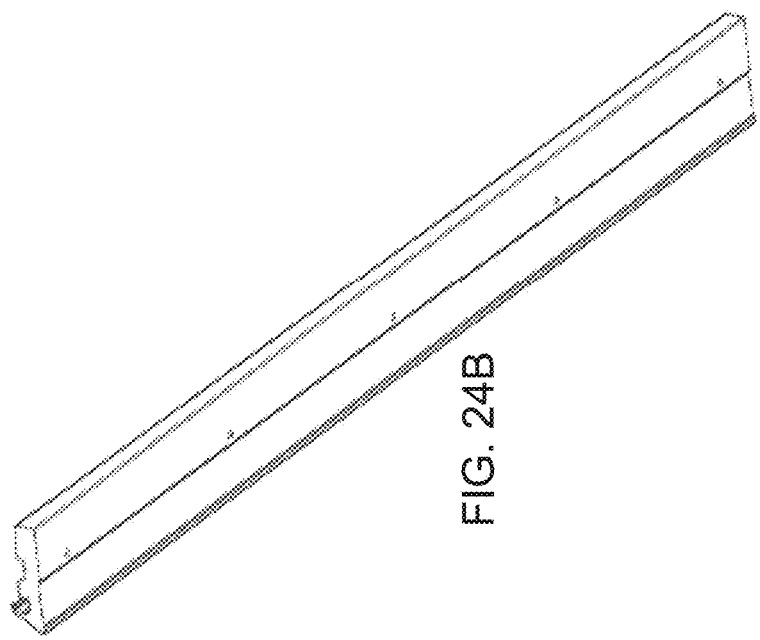
Figure 24A:
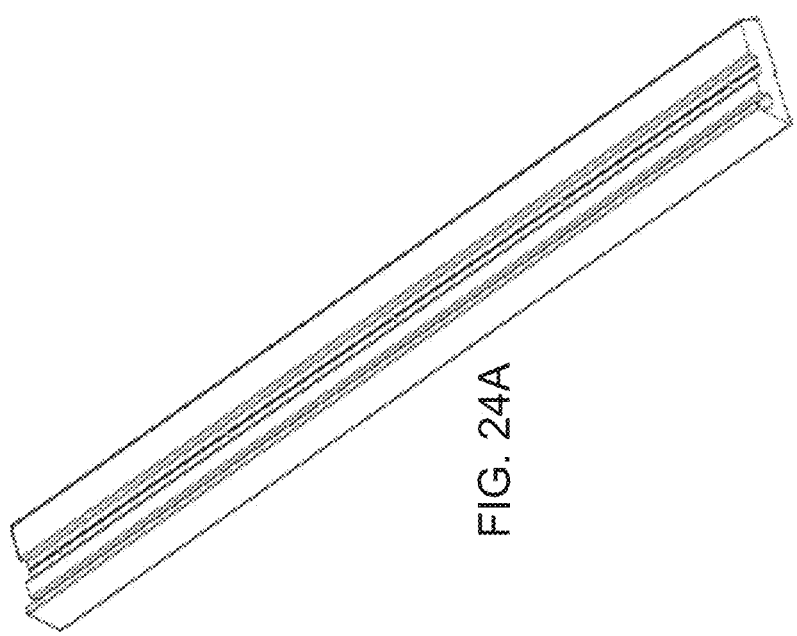
Figure 25:
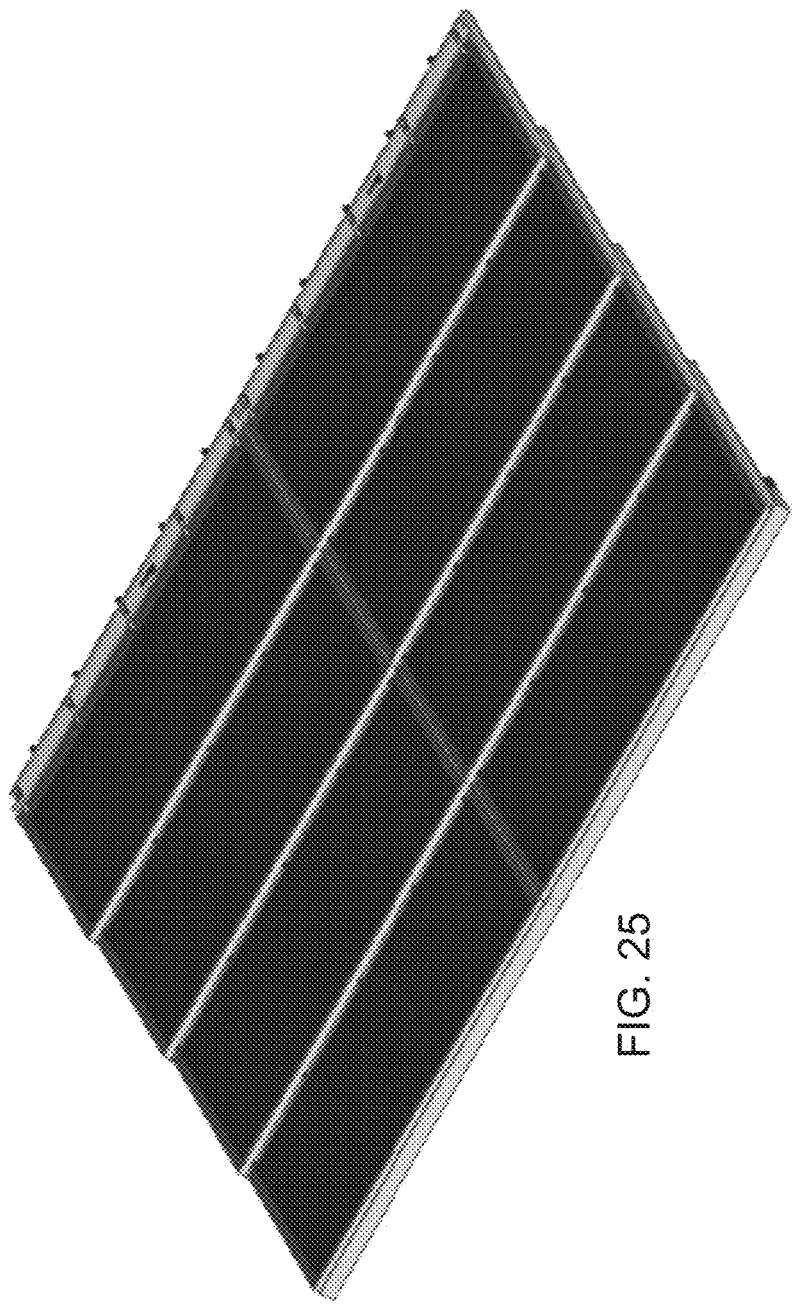
FIG. 25 is a schematic perspective view of a small array of the photovoltaic roofing elements of FIG. 22.

FIGS. 24A and 24B top and bottom perspective schematic views, respectively, of a starter strip for use with the lowermost course of an array of the photovoltaic roofing elements of FIG. 22. The starter strip has recesses for receiving ridge structures beneath the lower leading lip of the frame of an overlying photovoltaic roofing element as shown in FIG. 21. Since the photovoltaic roofing elements in an array generally overlap a fastening zone of a photovoltaic roofing element in a lower course in an array and are slightly canted on the roof, the starter strip or cant strip serves to raise the bottom edge of the photovoltaic roofing elements in the lowermost course so that all of the photovoltaic roofing element in the array are similarly angularly oriented, and closes the leading edge of the array. The leading down-roof edge may serve as a retaining clip for engaging the lower lip of an overlying photovoltaic roofing element. Optionally, not shown, recesses may be provided in the starter strip to accommodate wind clips for further securing the lower edge of an overlying photovoltaic roofing element. Moreover, while the starter strip of FIGS. 24A and 24B is shown as being substantially solid, in other embodiments it is at least partially hollow in cross-section. Starter strips (both solid and at least partially hollow) can be made via extrusion, FIG. 25 shows a small array of the photovoltaic roofing elements of FIG. 22. The array of FIG. 25 is two photovoltaic roofing elements wide and four photovoltaic roofing elements high. It includes starter strips. Side and top flashing (not shown) can be provided as described in U.S. Provisional Patent Application Ser. No. 61/429,053 (and as described in more detail below), to close the array at the sides and top and merge the photovoltaic array into a field of surrounding conventional shingles.

Figure 26:
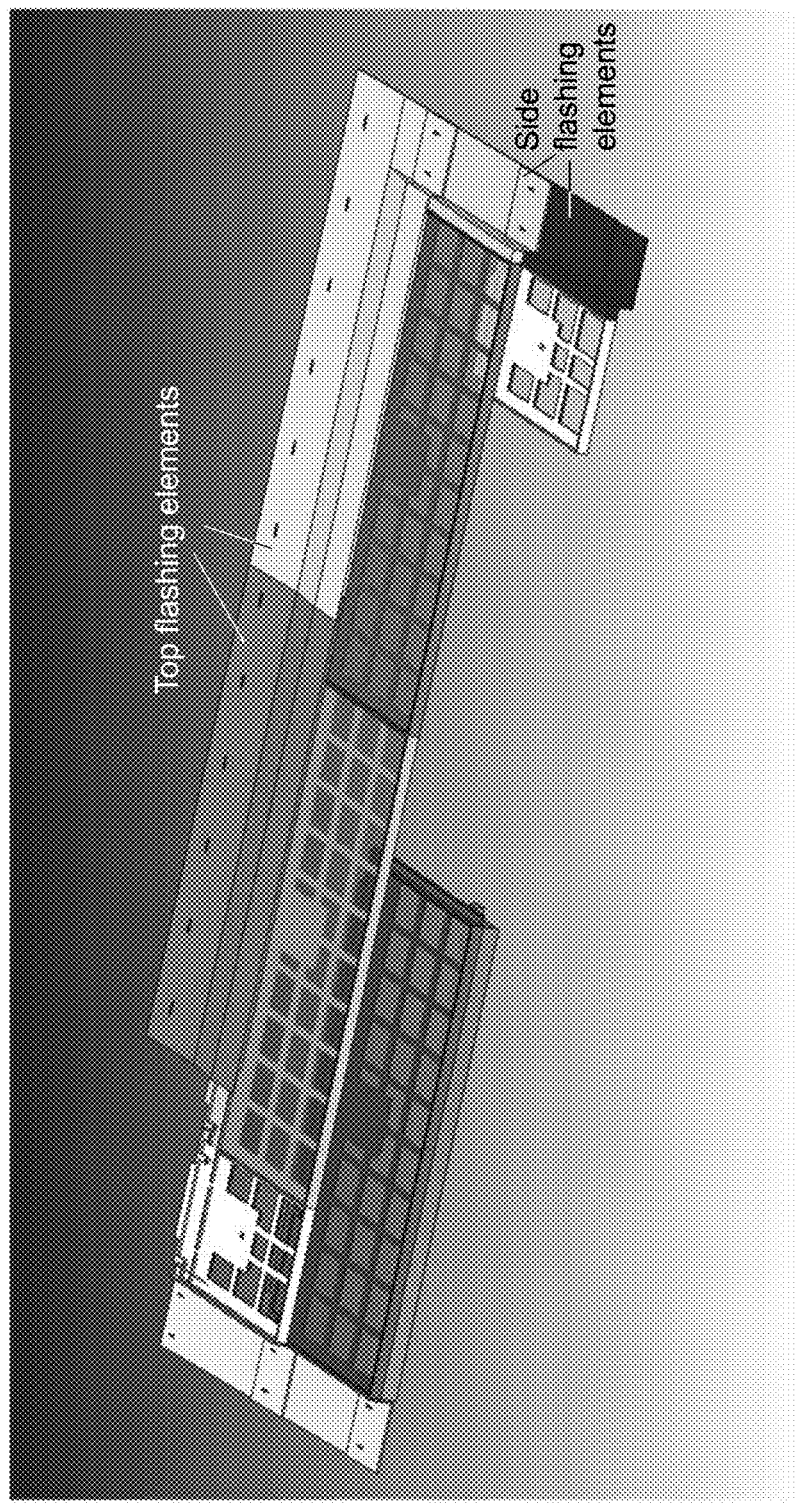
FIG. 26 is a partial schematic perspective view of a photovoltaic roofing system according to one embodiment of the invention.

Certain aspects of the invention relate to the fashion in which flashing elements are provided to close the transition that merges a photovoltaic array made up of photovoltaic roofing elements into the field of conventional roofing products used in conjunction with the photovoltaic roofing elements. Flashing elements as installed together with a small array of photovoltaic roofing elements (frame structures shown) are shown in perspective view in FIG. 26.

Accordingly, one aspect of the invention is a photovoltaic roofing system disposed on a roof deck having a top end (i.e., toward the ridge of the roof) and a bottom end (i.e., toward the eave of the roof). The photovoltaic roofing system includes one or more photovoltaic roofing elements contiguously disposed on the roof deck, the contiguously-disposed roofing elements together having a top edge facing the top end of the roof deck, a bottom edge facing the bottom end of the roof deck, and two side edges. Each photovoltaic roofing element comprises one or more photovoltaic elements disposed on a frame structure. The frame structure includes sidelap portions having geometries adapted to interlock with adjacent photovoltaic roofing elements to provide water drainage channels. The photovoltaic roofing system also includes a plurality of roofing elements disposed adjacent the contiguously-disposed photovoltaic roofing elements, along their side edges. The photovoltaic roofing system further comprises side flashing elements disposed along the side edges of the contiguously-disposed photovoltaic roofing elements, the side flashing elements having a cross-sectional shape comprising a vertically-extending feature and a flange extending away from a lateral side at the downward end of the vertically-extending feature, with the flange facing away from the contiguously-disposed photovoltaic roofing elements and being at least partially disposed between a roofing element and the roof deck. The vertically-extending feature includes a matched interlocking geometry adapted to interlock with the sidelap portion of an adjacent photovoltaic roofing element. For example, in certain embodiments, the vertically-extending features of the side flashing elements along a first lateral edge of the contiguously-disposed photovoltaic roofing elements include a downward-facing flange, disposed in upward-facing channels of the photovoltaic roofing elements disposed along the first lateral edge; and wherein the vertically-extending features of the side flashing elements along a second lateral edge of the contiguously-disposed photovoltaic roofing elements include an upward-facing water drainage channel, into which downward-facing flanges of the photovoltaic roofing elements disposed along the second lateral edge are disposed.

Preferably a top flashing and/or a bottom flashing are also included to merge the photovoltaic roofing system with a field of conventional roofing products and close the transition areas therebetween to the elements. Accordingly, in certain embodiments, one or more top flashing elements is or are disposed along the top edge of the contiguously-disposed photovoltaic roofing elements, the one or more top flashing elements having a bottom end disposed over the top edge of the contiguously-disposed photovoltaic roofing elements; and a top end disposed under one or more roofing elements disposed along the top edge of the contiguously-disposed photovoltaic roofing elements.

FIGS. 27, 28 and 29 show top schematic views and edge schematic views of examples of top flashing elements for closing the top portion of the array of photovoltaic roofing elements according to one embodiment of the invention. In these figures, the top plan views depict the leftmost side of a given flashing section near the top of the drawing and the rightmost side near the bottom of the drawing. In FIG. 11, the lineal or standard piece for flashing the array, but not at an edge of the array, has hidden lap alignment features. At the left end of the flashing element, a portion is thinned for a distance on the bottom of the piece, dashed lines indicating the thinning on the bottom. At the right end, the thinning is at the top. When adjacent flashing elements are installed across the array, the left end overlaps the right end of an adjacent section of flashing. The thinning of the end provides an indicator for proper lateral overlap at the end. From left to right in FIG. 27, the flashing has three zones. The two left zones go up and over the upper edge of the topmost course of the photovoltaic roofing panels in the array. The right portion is flat on the roof deck. Conventional roofing materials are installed so that they overlap at least the right uppermost portion of the top flashing to direct moisture down the roof. In some instances, the exposure zone of a conventional roofing product may extend to cover the majority, or completely cover, the top flashing elements across the photovoltaic roofing product array. FIG. 28 shows views of a right end top flashing element. The upper flat flange in the plane of the roof deck extends around to the right end beyond the raised bend feature. FIG. 29 shows views of a left end top flashing element, the flashing flange extending around to the left. The raised bend feature covers the top edge of the photovoltaic roofing array. The flanges underlie adjacent conventional roofing materials. The flashings can be formed from a variety of materials; for example, they can be molded or formed from plastic or metal.

FIG. 30 is a set of schematic views (top, back, side and front) of a right side flashing element for use with photovoltaic roofing elements of FIGS. 1, 1A and 2 according to one embodiment of the invention. The right side flashing element is installed along the right edge of a set of contiguously-disposed photovoltaic roofing elements. It includes an overlap portion 3010 and an exposed portion 3015. The top schematic view of FIG. 30 has the uppermost portion of the right flashing at the lower end of the figure. A cut-back notch 3020 is provided so that an overlying right side flashing element can fit into the underlying piece with a flush right edge. The side schematic view in FIG. 30 shows that the right side flashing element has a greater height at its lower end (left side of the side schematic view) than at its upper end, to accommodate the canting of the photovoltaic roofing elements in the course as they overlie the underlying course. The front view (i.e., looking up the roof) and the back view (i.e., looking down the roof) show downward directed ridges that interact cooperatively with the underlying drainage channel at the right side edge of the roofing panel of FIG. 1. The downward directed structures are analogous to the structures shown at the left edge of the photovoltaic roofing element of FIG. 1. The right side flashing element engages with the right side edge of the roofing panel in a shiplap fashion, with the flange (i.e., overlap portion 3010) extending under adjacent conventional roofing material to flash in and close the roof to the elements. In some embodiments, the flange extends at least about 2 inches, at least about 4 inches, at least about 6 inches, or at least about 8 inches or more under the adjacent roofing materials. It will be understood that for use with photovoltaic roofing elements of another dimension, the size and proportion of the right side flashing elements may be suitably adapted.

Figure 31:
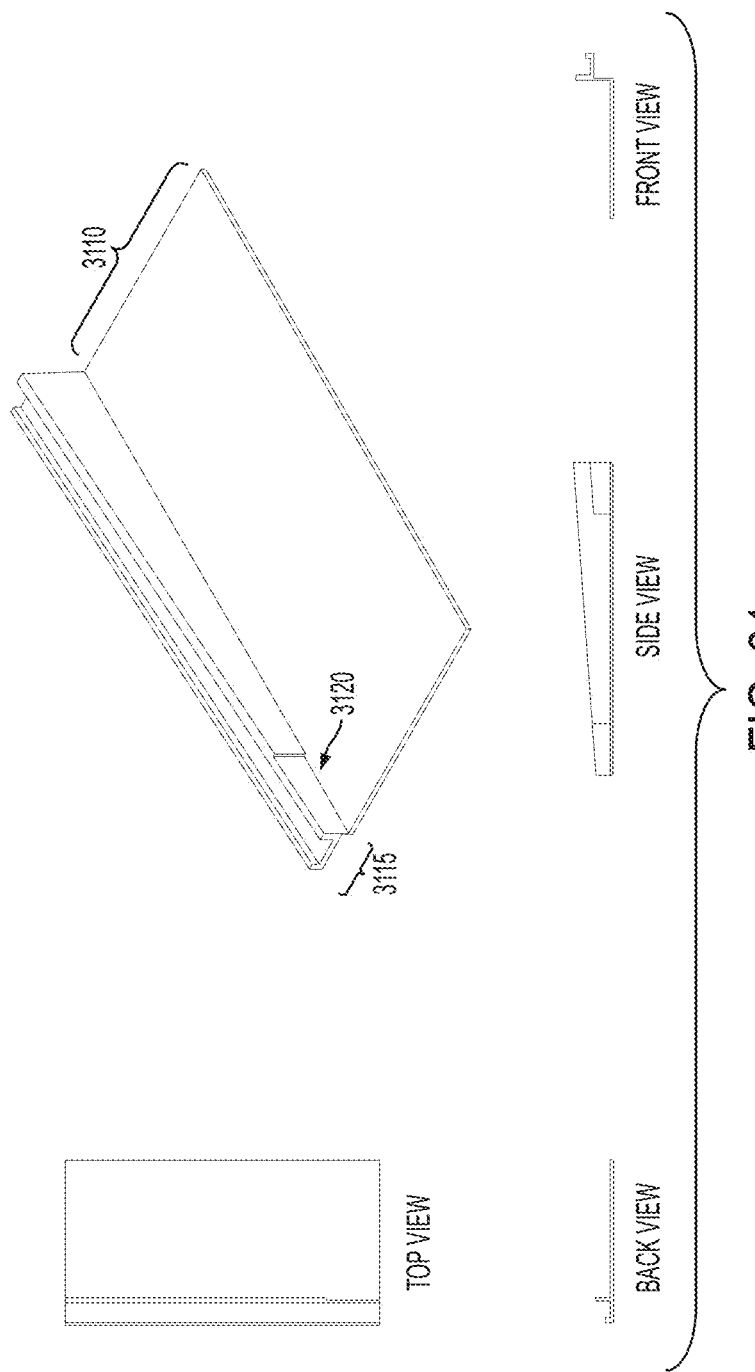
FIG. 31 is a set of schematic views of opposing side flashing pieces suitable for use in certain embodiments of the invention.

FIG. 31 is a set of schematic views (top, back, side, front and perspective) of a left side flashing element for use with photovoltaic roofing elements of FIGS. 1, 1A and 2 according to one embodiment of the invention. The left side flashing element is installed along the left edge of a set of contiguously-disposed photovoltaic roofing elements. It includes an overlap portion 3110 and an exposed portion 3115. The top view of FIG. 31 has the uppermost portion of the left side flashing element at the lower end of the figure. A cut-back notch 3120 is provided so that an overlying left side flashing element can fit into the underlying piece with a flush left edge. The side view in FIG. 31 shows that the left side flashing element has a greater height at its lower edge (at the right side of the figure) than at its upper end to accommodate the canting of the photovoltaic roofing elements in the course as they overlie the underlying course. The front view of the left side flashing element is taken looking up the roof and the back view is taken looking down the roof. The front view (i.e., looking up the roof) and the back view (i.e., looking down the roof) show the upward-directed edge ridge and drainage channel that interact cooperatively with the overlying downward-directed ridges at the left side edge of the photovoltaic roofing element of FIGS. 1, 1A and 2. The upward directed ridge and drainage channel are analogous to the structures shown at the right edge of the photovoltaic roofing element of FIG. 1. Preferably, the left side edge flashing is installed prior to installation of a leftmost photovoltaic roofing element in a course. The left side edge flashing element engages with the left side edge of the photovoltaic roofing element in a shiplap fashion and provides a flange (i.e., the overlap portion 3110) to extend under adjacent conventional roofing material to flash in and close the roof to the elements. In some embodiments, the flange extends at least about 2 inches, at least about 4 inches, at least about 6 inches, or at least about 8 inches or more under the adjacent roofing materials. It will be understood that for use with photovoltaic roofing elements of another dimension, the size and proportion of the left side flashing elements may be suitably adapted. It will also be understood that if geometries of parts of the roofing system including photovoltaic roofing elements and flashing components are reversed, such as for example by mirroring, that preferred orders of installation may also accommodate such changes.

Figure 32:
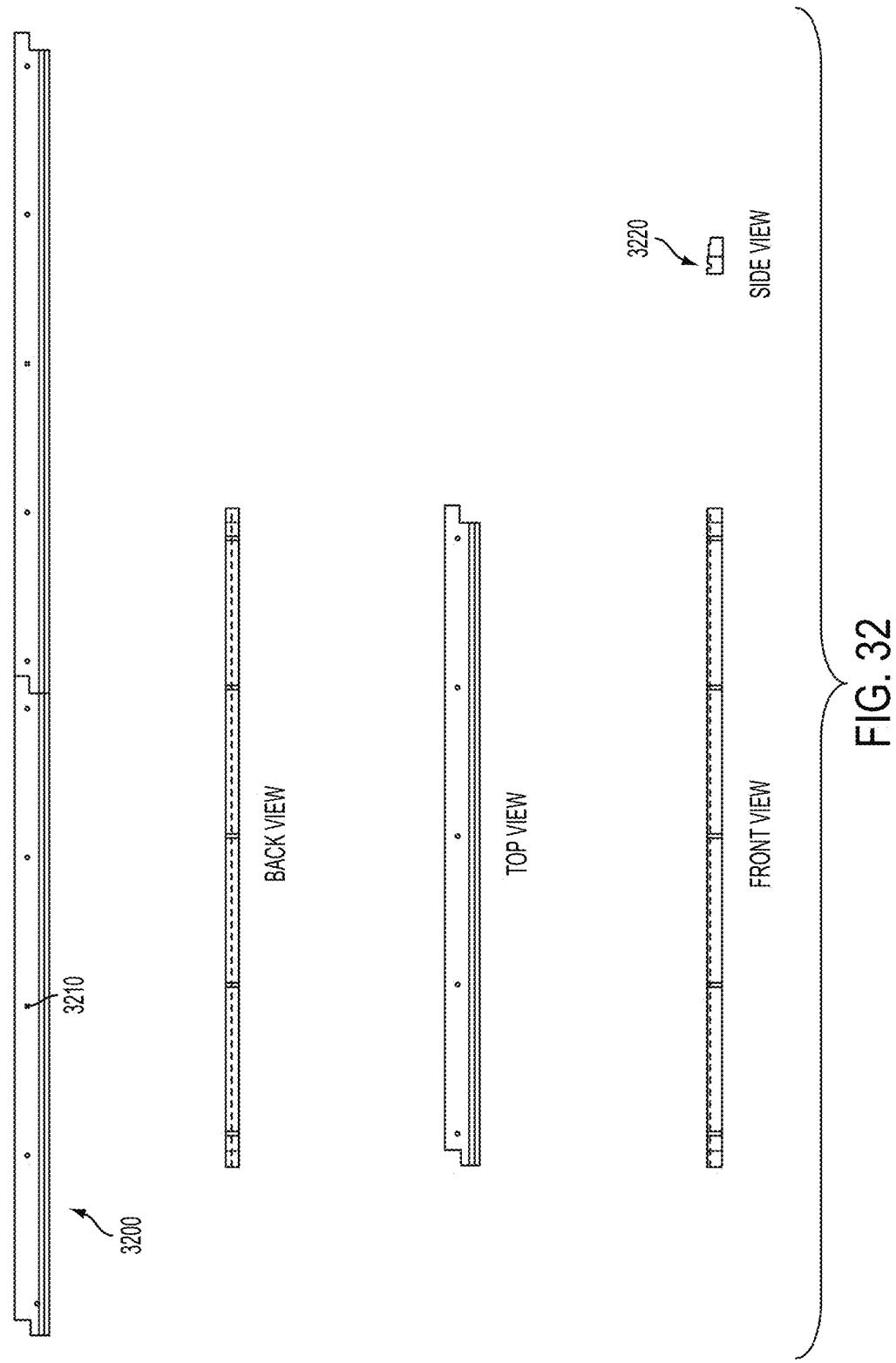
FIG. 32 is a set of schematic views of cant strips suitable for use in certain embodiments of the invention.

FIG. 32 shows various schematic views of an embodiment of a cant strip 3200 (e.g., a starter strip) according to one embodiment of the invention. In use, the cant strip can be disposed under the bottom edge of the contiguously-disposed photovoltaic elements and on top of an underlying course of roofing elements. The cant strip can serve to close the lower edge of an array of photovoltaic roofing elements. In the top views, fastening holes 3210 are visible; these are provided to attach the strip to a roof. An offset shape for dovetailing adjacent strips one to another is provided to help minimize the potential for water intrusion. The back view (i.e., down roof view) and front view (i.e., up the roof) show internal support ribs in phantom. The side view shows a recess 3220 for receiving a locator ridge that would extend on the downward-facing surface of the bottom end of an overlying photovoltaic roofing element. The side view shows that the height of the strip is greater on the down-roof side and thinner on the up-roof side. The cant strip serves to provide an angular deviation from the plane of the roof so that the lowermost course of photovoltaic roofing elements is substantially plane parallel to successive courses. Accordingly, in certain embodiments, the thickness of the cant strip is substantially similar to the thickness of an installed photovoltaic roofing element at its top end, as measured in a direction normal to the roof surface.

Figure 33:
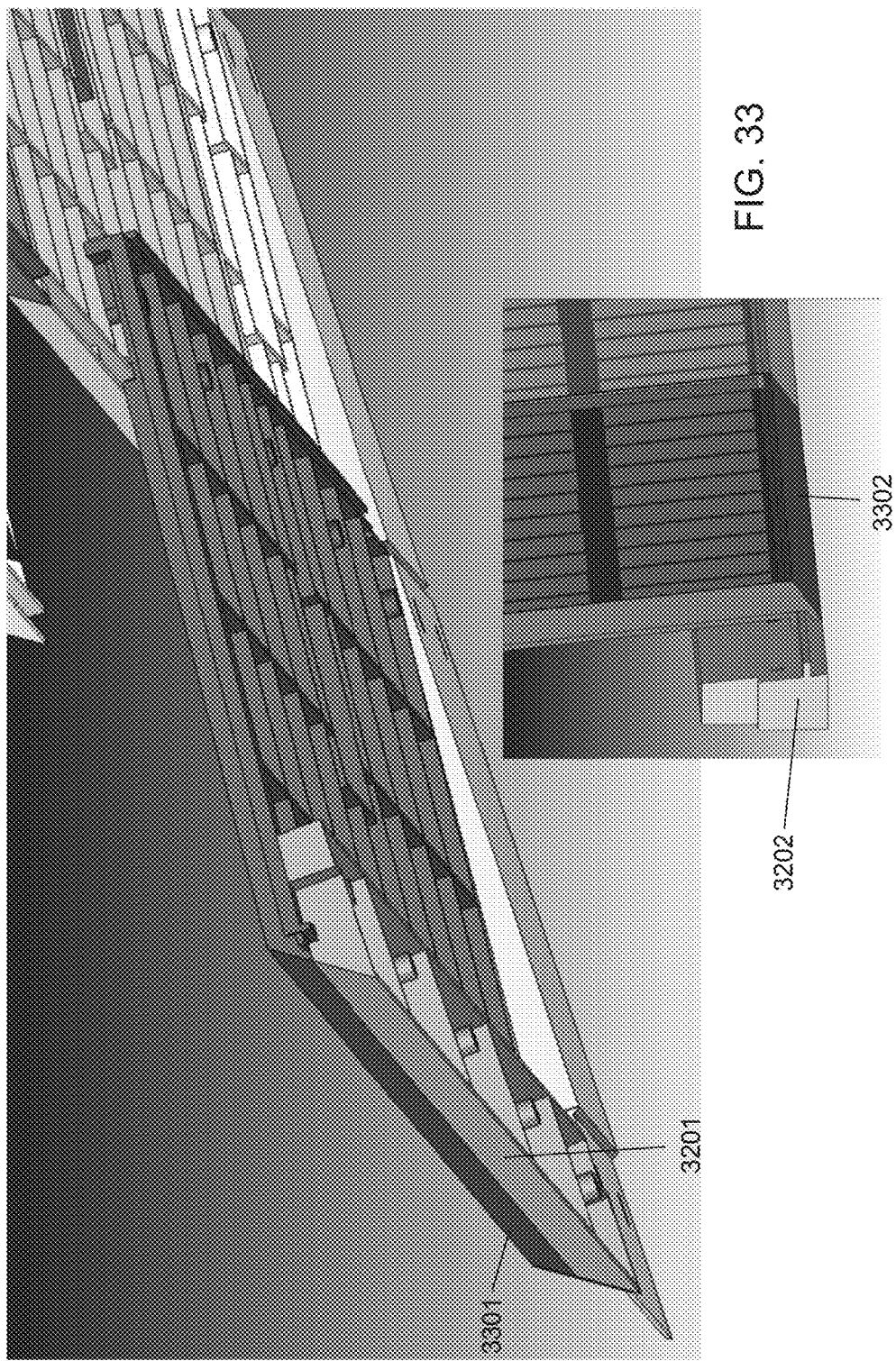
FIG. 33 is a pair of partial schematic perspective views of a photovoltaic roofing system according to one embodiment of the invention.

FIG. 33 is a pair of perspective views of cant strips in position under a photovoltaic roofing element as described with respect to FIGS. 1, 1A and 2. Each cant strip 3201, 3202 is cooperatively engaged with the lowermost photovoltaic roofing element of an array. The cant strip 3201 has a recess that interacts with a locator ridge on the downward-facing surface of the lowermost photovoltaic roofing element 3301. The leading edge of the cant strip is angled to match the angle of the photovoltaic roofing element and continue a downward slope for direction of water on the roof. In the inset, cant strip 3202 has a locator ridge, which interacts with a recess formed in the downward-facing surface of the photovoltaic roofing element 3302.

It will be noted that the downward-facing surfaces of the photovoltaic roofing elements of FIG. 33 (and other FIGS., including FIG. 26) have a plurality of downward-facing support structures, here, ribs formed in a grid structure. The downward-facing support structures serve to reduce the amount of material necessary to provide a supportive frame structure. They also provides a degree of rigidity to minimize flexing so that the photovoltaic elements are supported with minimal deformation stresses imparted; this can be especially important when rigid photovoltaic elements are used. Moreover, thermal expansion and contraction effects can also be balanced in part by such a structure. The ribbed structure can also provide locations for securing junction boxes and electrical components for the photovoltaic elements held by the frame structure. In the embodiment of FIG. 33, the support structures are intersecting ribs, but the person of skill in the art will appreciate that other structures could be used.

As noted above, FIG. 26 is a top perspective schematic view of a partial assembly of photovoltaic roofing elements and flashing components. The photovoltaic roofing elements are similar to those of FIGS. 1, 1A and 2, the photovoltaic elements being shown as semitransparent. In the frame structures, the exposure area is underlied by slats (here, criss-crossing), spaced to support the photovoltaic elements, but allowing wiring to run from the downward-facing side of the photovoltaic elements to the downward-facing surface of the photovoltaic roofing element, thereby protecting it from weather. In this embodiment, the slat structure also includes a square pad for the attachment of larger electrical components, for example, a junction box for wiring together individual photovoltaic elements and providing a single electrical output for the overall photovoltaic roofing element. In the array of photovoltaic roofing elements of FIG. 26, the individual photovoltaic roofing elements are laterally offset from one another; this offset configuration provides a visual effect similar to some conventional roofing materials. Shorter framing structures are included to fill in the offset so that the array has common linear left and right edges. These fill pieces may include photovoltaic elements (not shown), or may include another upper surfacing media (not shown) with a complementary visual appearance to the photovoltaic roofing elements and/or associated conventional roofing elements to be installed therearound. Left side flashing elements are included in the assembly of FIG. 26, applied in an overlapping fashion and cooperatively engaged with the left edge of the photovoltaic roofing elements as described above. A cant strip is provided to raise the lower leading edge of the bottommost course of photovoltaic roofing elements as described above. Right side flashing elements are included to cooperatively engage the right side edges of the photovoltaic roofing elements as described above. It will be noted that fastening locations for the side flashing elements are such that a lower fastening location of each unit is suggested and that an upper fastening point is accomplished by successive fastening of the next overlying course flashing element. Top flashing elements are also included in the assembly of FIG. 26. The top right end flashing element includes the flange to the right to underlie adjacent conventional roofing elements, and includes raised bend portions to step up and onto the contiguously-disposed photovoltaic roofing elements at the edge thereof. In this instance, the right top end flashing element overlaps the center top flashing element with a hidden alignment overlap. In this instance, the top flashing elements are depicted with fastening slots. With slots it may be desirable to fasten the pieces to the roof in a non-hardnailing manner so that larger pieces may move laterally to accommodate thermal expansion and contraction. It will be understood that in certain instances, an alignment undercut or thinning may be omitted, in which case, it may be desirable for the flashing elements to float freely analogously to conventional vinyl siding to accommodate thermal expansion and contraction in use. It will be also understood that in a wider array including a greater number of photovoltaic roofing elements, a larger number of top center flashing elements may be employed. A left top end flashing element is not shown in FIG. 26, but the person of skill in the art would understand that a full assembly can include one.

Figure 34:
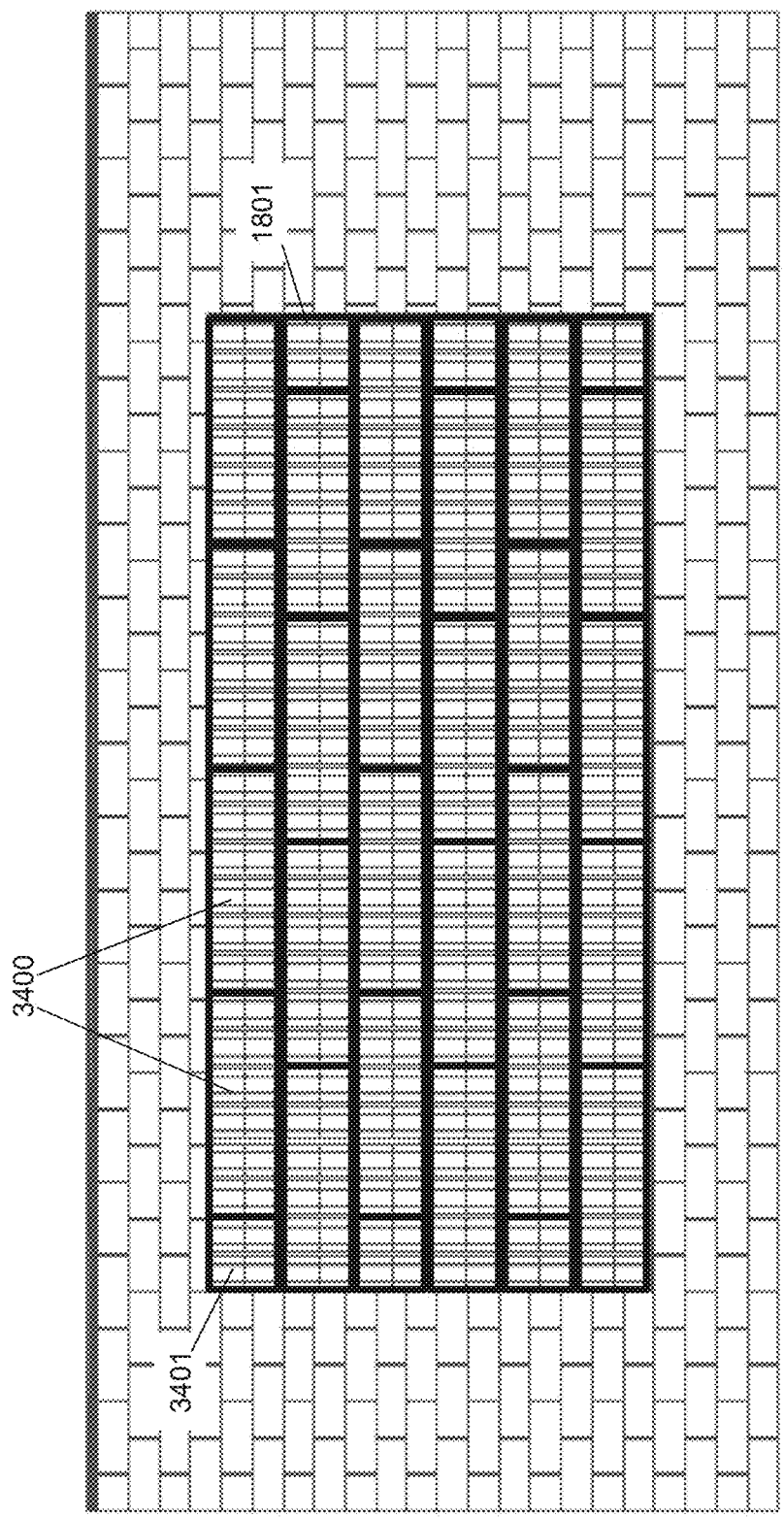
FIGS. 34 and 35 are schematic plan views of photovoltaic roofing systems according to certain embodiment of the invention.

FIG. 34 is a schematic top view of a photovoltaic roofing system, in which a rectangular array of contiguously-disposed photovoltaic roofing elements as described above is installed on a roof with conventional metric three-tab shingle of 13¼"×39⅜" dimension and 5⅝" exposure. Each photovoltaic roofing element 3400 includes 2 rows of 6 six-inch square photovoltaic elements. The photovoltaic roofing elements are offset by using shorter photovoltaic roofing elements 3401 at alternate ends of the courses, each shorter photovoltaic roofing element having 2 rows of 2 photovoltaic elements. In some embodiments an offset is preferred so that continuous alignment of a large number of drainage channels in the shiplap portion of the photovoltaic roofing elements does not occur vertically up the array. The offset of the photovoltaic roofing elements enables a lateral offset of the drainage channels at the right side edge in the ship lap portion of the photovoltaic roofing element so that drainage can occur over the face of underlying courses of photovoltaic roofing elements. In this way, in heavier rain situations, overloading of aligned drainage channels is avoided. The shorter fill panels include all of the edge features of the larger photovoltaic roofing elements. Sections of cant strip (not shown) are included along the lower edge of the array. Left side edge flashing (not shown) is provided along the left edge of each course of photovoltaic roofing elements in the array. Right side edge flashing (not shown) is provided at the right edge of each course of photovoltaic roofing elements. Top flashing (not shown) with molded edge flashing for the ends of the array is included across the top of the array and covered by overlying shingles.

Figure 35:
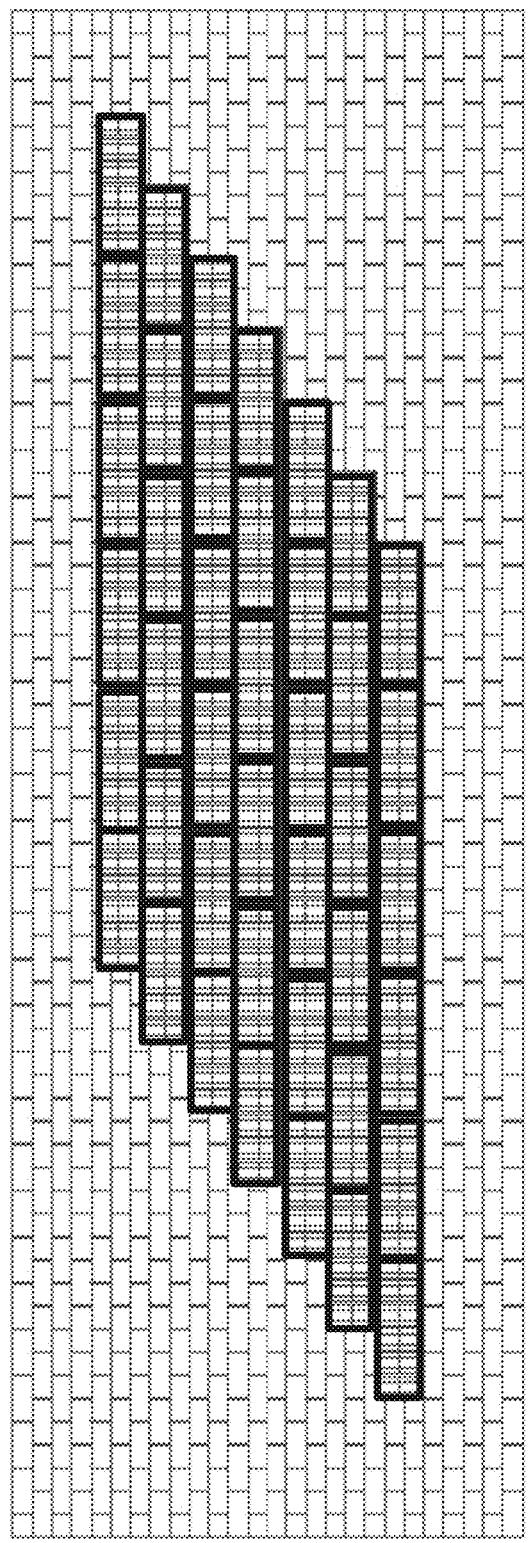

FIG. 35 shows a diagonally stepped array of photovoltaic roofing elements on a roof of three-tab shingles. The offset provides the drainage features as noted above. In this array, the left end of each course includes a left side flashing unit and a short piece of left end top flashing unit to flash in the diagonal step up the array and close the roof for drainage. Right side edge flashing and cant strips are provided at the right end of each course.

FIG. 36 depicts an alternative side flashing configuration, in which one or more side flashing elements is configured such that a conduit is formed underneath the side flashing element and adjacent the frame structure of the photovoltaic roofing element with which it interlocks. Frame structure 3600 includes an upward-facing water drainage channel 3605. Side flashing 3610 includes a vertically-extending feature 3612 which has a downward-facing flange 3615, which fits into upward-facing water drainage channel 3605. Side flashing also includes a flange 3618 extending away from the frame structure, on which a roofing element (here, a shingle 3620) is disposed. Notably, the vertically-extending feature also extends horizontally (shown by ref. no. 3613) sufficiently to form a conduit 2030 adjacent the frame structure. Wiring 3635 is shown disposed in the conduit. Accordingly, the flashing can act as a conduit to track the wiring up or down a side of an array to a convenient location for wire take off from the roof or, in certain instances, a convenient location for a roof penetration.

FIG. 37 is a perspective view of an alternative side corner flashing for use in a stepped diagonal array with an offset in the photovoltaic roofing elements (e.g., as shown in FIG. 35). In this case the water drainage channel 3705 directs moisture downward on the roof over an underlying course of shingles and a horizontal flange 3720 extends further over an attachment zone of a panel of the underlying course so that it may be flashed in with conventional roofing products.

FIG. 38 depicts a roof in which the contiguously-disposed photovoltaic roofing elements 3800 are to fit into an area with diagonal sides. Inserts 3830 with an angled side are provided that have appropriate side interlocks and drainage channels to fit in with the photovoltaic roofing elements of the array. A variety of angled parts (e.g., 3831, 3832, 3833) that interlock into the roofing panels may be provided to fit different angular roofing situations.

Figure 39:
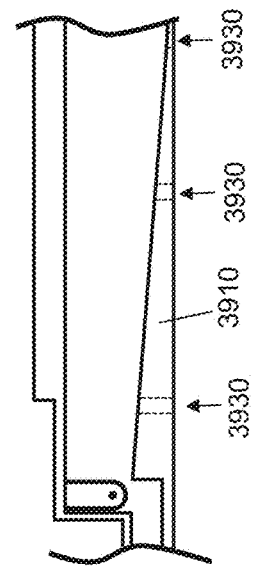
FIG. 39 is a pair of partial schematic views of a photovoltaic roofing element according to one embodiment of the invention.

In some embodiments, as shown in FIG. 39 in partial schematic view, one or more diagonal ridges are disposed in the attachment zone. The ridge(s) are disposed such that, when the photovoltaic roofing element is installed, they are sloped toward the bottom end thereof, such that water entering the attachment zone may traverse down to a drainage hole or channel and then out over the top surface of the exposure area, and then down the roof. In FIG. 39, ridge 3910 is disposed at a diagonal with respect to the horizontal axis of framing structure. Drains or weep holes 3930 may also be provided periodically along the length of a diagonal water dam in the attachment zone as depicted in FIG. 39.

Figure 40:
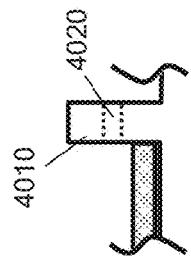
FIGS. 40-42 are schematic cross-sectional views of ridge structures suitable for use in certain embodiments of the invention.
Figure 41:
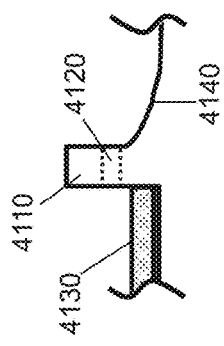
Figure 42:
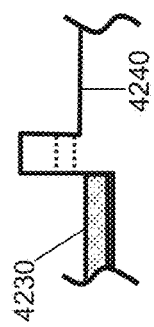

FIG. 40 is a schematic cross-sectional view of a ridge 4010 with a drain channel 4020 in phantom. The ridge is one configuration for a first dam in an attachment zone above the exposure zone of a roofing element. Any water intrusion into the attachment zone can be directed downward and out through the drain opening or to the edge of the photovoltaic roofing element and down the water drainage channel at the side. FIG. 41 is a cross-sectional view of another configuration, in which a photovoltaic element 4130 is present in the exposure area on the downward side of the ridge 4110 (left in the figure). The top planar surface of the photovoltaic element is above the plane of the attachment area higher up the roofing panel. In the drain slot 4120 through the ridge of FIG. 41, the base of the slot (shown in phantom) is at or slightly above the same plane as the top surface of the photovoltaic element, such that water flows across the photovoltaic element, instead of underneath it. The surface 4140 of the attachment zone is tapered upwards, such that water is delivered to the drain slot. One benefit of the ramp structure is that water would be delivered over the surface of the photovoltaic module and away from sealed joint between the photovoltaic element and the frame structure. FIG. 42 is a schematic cross-sectional view of another modification of the drainage system, with the base plane 2640 of the attachment zone at a level even with or above the plane of the photovoltaic element 4230 so that water is delivered from the attachment zone over the photovoltaic element below without the need for a ramp or taper. The ridge structures of FIGS. 40, 41 and 42 can be used, for example, as a ridge at the bottom end of the attachment zone as described above with respect to FIG. 1.

Figure 43:
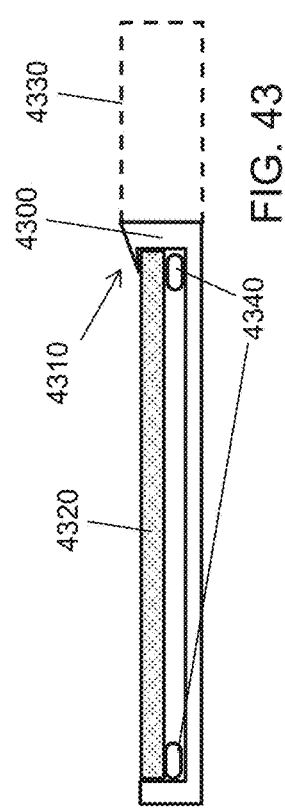
FIGS. 43 and 44 are partial schematic views of photovoltaic roofing elements according to certain embodiments of the invention.

FIG. 43 is a cross-sectional view of a portion of a frame structure equipped with a photovoltaic element. The frame structure 4300 includes, at the top end of the exposure zone, a receiver flange 4310 which secures the upper edge of the photovoltaic element 4320. The attachment zone is shown in phantom by reference numeral 4330. Sealant 4340 is depicted around the perimeter of the photovoltaic element to seal the photovoltaic element to the frame structure.

Figure 44:
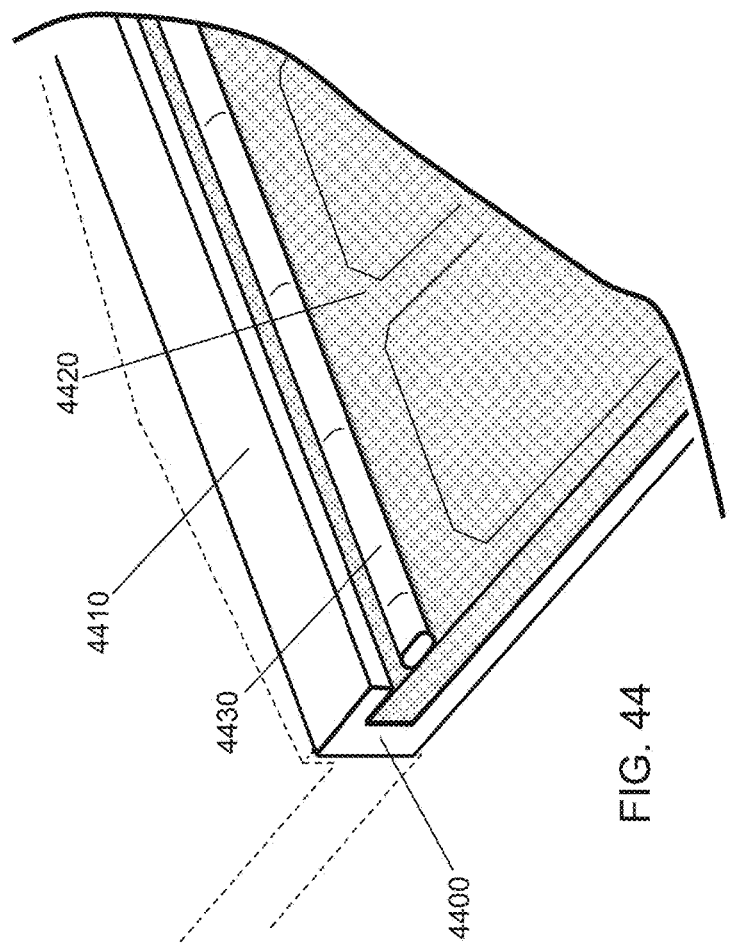

In FIG. 44, another embodiment of a frame structure equipped with a photovoltaic element is shown in partial perspective view. A receiver flange 4410 is provided at the top edge of the frame structure 4400 as described with respect to FIG. 43. In the embodiment of FIG. 44, a dam strip 4430 is disposed on the upward-facing surface of the photovoltaic element 4420, above the top of the active area of the photovoltaic element. The dam strip is raised from the surface of the photovoltaic element, and can cooperate with a recess on the underside of the leading edge of an overlying photovoltaic roofing element to aid in closure of the system to moisture. The dam strip can be applied to the surface of the photovoltaic element after it is installed. In one embodiment, the dam strip is installed with a gentle angle, with one end of the dam strip closer to the top end of the photovoltaic roofing element than the other, in order to guide any moisture that would intrude over the dam to the water drainage channel at the side edge of the roofing panel. Optionally, the dam strip may comprise a sealant to close the system to water.

In certain embodiments, the frame structure is rigid. Suitable materials for the framing structure include polycarbonate and other polymers. Filled polyolefins such as polypropylenes and copolymers or polyvinyl chloride, CPVC, ASA or AES can be used for the various flashing components. Parts can be made by extrusion followed by forming such as sizing or vacuum forming, depending on the polymer and its flow properties, or by molding processes such as injection molding or compression molding. Filled polymers and composites with low thermal expansion coefficients are preferred.

A photovoltaic roofing system has been described that can integrate photovoltaic roofing elements with conventional roofing products. The system can provide edge, top and bottom closure for the roof against the elements. Lateral interlocks and drainage channels can contribute to the closure of the roof. Ridges and grooves can provide tortuous pathways to inhibit moisture transgression into the roof. Raised nail bosses or fastening points can provide another level of difficulty for moisture entry through the roof. Aspects that are useful for the prevention of entry of wind driven rain can also be useful for electrical considerations in maintaining electrical components in a dry environment.

The canted or extended leading edge of the photovoltaic roofing elements described herein can provide for easy downward flow of moisture on the roof. If moisture intrusion occurs in the attachment zone, a ridge structure with weep holes for drainage can inhibit further intrusion of the moisture. A ridge near the top edge of the attachment zone can prevent overflow of the attachment zone and helps direct moisture to drainage channels. In some cases the downward-facing surface of the leading edge of the photovoltaic roofing element includes recesses that can receive the ridges and further assist in directing moisture down the roof.

In preferred photovoltaic roofing systems the parts are available in modular components that fit together and can be kitted in advance to minimize the need for fabrication on site. For example, flashing components and cant strips, in this instance, are provided in lengths that are integral multiples of the dimensions of the photovoltaic roofing elements or partial photovoltaic roofing element sizes to accommodate predetermined arrays for the roofing system in dimensions and power ratings suitable for a particular roofing project. Accordingly, assembly on the roof can be simplified.

Any cabling or wiring interconnecting the photovoltaic roofing elements of the invention in a photovoltaic roofing system can, for example, be long and flexible enough to account for natural movement of a roof deck, for example due to heat, moisture and/or natural expansion/contraction. The cabling or wiring can be provided as part of a photovoltaic roofing element, or alternatively as separate components that are interconnected with the photovoltaic roofing elements (e.g., through electrical connectors) during installation.

Examples of electrical connectors that can be suitable for use or adapted for use in practicing various embodiments of the invention are available from Kyocera, Tyco Electronics, Berwyn, Pa. (trade name Solarlok) and Multi-Contact USA of Santa Rosa, Calif. (trade name Solarline). U.S. Pat. Nos. 7,445,508 and 7,387,537, U.S. Patent Application Publications nos. 2008/0271774, 2009/0126782, 2009/0133740, 2009/0194143 and 2010/0146878, each of which is hereby incorporated herein by reference in its entirety, disclose electrical connectors for use with photovoltaic roofing products. Of course, other suitable electrical connectors can be used. Electrical connectors desirably meet UNDERWRITERS LABORATORIES and NATIONAL ELECTRICAL CODE standards.

In certain embodiments, the photovoltaic roofing elements of the array are electrically interconnected. The interconnected photovoltaic array can be interconnected with one or more inverters to allow photovoltaically-generated electrical power to be used on-site, stored in a battery, or introduced to an electrical grid. For example, a single inverter can be used to collect the photovoltaically-generated power and prepare it for further use. In other embodiments, the photovoltaic roofing elements can be interconnected with a plurality of micro-inverters disposed on the roof. For example, a single micro-inverter can be used for each photovoltaic roofing element; or a single micro-inverter can be used for a group of photovoltaic roofing elements.

In certain embodiments of the invention, for example as described above with respect to FIGS. 5 and 8, the frame structure includes a wiring containment structure. The person of skill in the art can determine the length and position of the wiring containment structure, depending, for example, on the particular wiring scheme used for the overall photovoltaic roofing system envisioned. In the embodiment of FIGS. 5 and 8, the wiring containment structure is formed on the downward-facing surface of the frame structure, thereby allowing wiring to be contained under the frame structure. In another embodiment, shown in cross-sectional view in FIG. 45, a frame structure 4500 includes a plurality of downward-facing support structures 4510. The frame structure also includes a wiring containment structure, here a channel 4520, on the downward-facing surface of the frame structure. Accordingly, the wiring 4530 can be held in place such that it cannot be inadvertently pinched underneath the support structures.

Figure 45:
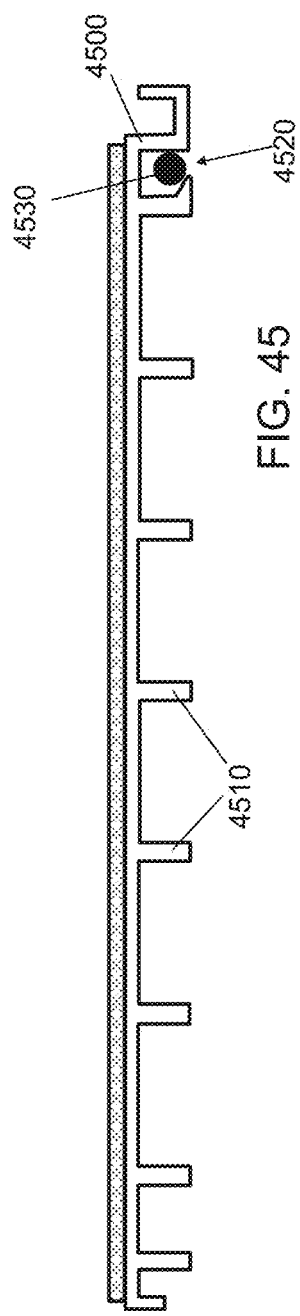
FIGS. 45-47 are schematic cross-sectional views of photovoltaic roofing elements according to certain embodiments of the invention.

In the embodiment of FIG. 45, the wiring containment structure is formed as a channel. In certain embodiments, and as shown in FIG. 45, the edges of the opening of the channel can be somewhat more narrow than the rest of the channel (and of the wiring to be contained therein), such that the wiring can "snap" in. In other embodiments, wiring can be held in the channel in other ways, for example using an adhesive, or using post-applied retaining elements such as fasteners.

Figure 46:
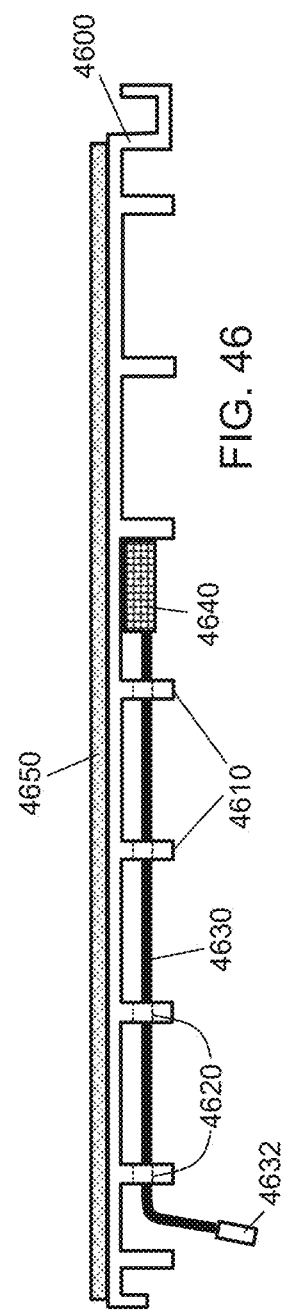

One embodiment of a framing structure is shown in cross-sectional view in FIG. 46. The frame structure 4600 includes downward-facing support structures 4610 (in this embodiment, ribs are formed in a criss-cross pattern, as shown in FIG. 33). At least some of the downward-facing support structures can substantially contact the roof when installed. The frame structure also includes a wiring containment structure 4620 that creates a path for wiring 4630 to run along the downward-facing surface of the frame structure, without being caught between the downward-facing support structures and the roof deck. In this embodiment, the wiring containment structure is a series of holes or notches (shown in phantom) cut in the downward-facing support structures; wiring can traverse the downward-facing surface of the through the holes or notches. The wiring containment structure can, for example, run from the junction box to the top end of the frame structure, then to the corner of the frame structure for attachment to an adjacent photovoltaic element, for example as shown in FIGS. 5 and 8.

The frame structure of FIG. 46 is shown equipped with a photovoltaic element 4650 to form a photovoltaic roofing element. The photovoltaic element includes a junction box 4640. The junction box can be used to contain interconnections of various photovoltaic cells of the photovoltaic element, and to provide a single output for the electrical power of the photovoltaic element. Wiring can emerge from or plug into the junction box, and run from there through the wiring containment structure. As shown in FIG. 46, the wiring runs through the wiring containment structure, and is terminated with a connector 4632.

Figure 47:
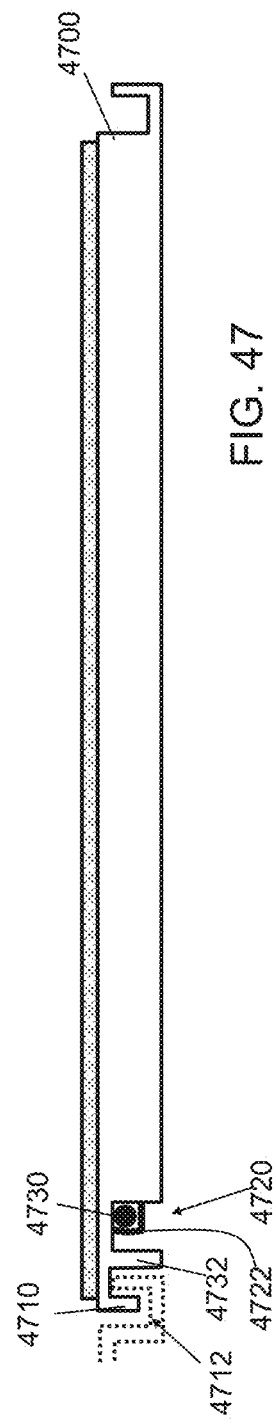

In certain embodiments, the wiring is run adjacent to a physical feature that provides a physical interlock between adjacent photovoltaic roofing elements, such as the shiplap interlocking features described above or a tongue-in-groove feature. In such embodiments, a wire containment feature can hold the wire in place such that it cannot inadvertently be caught or pinched in the physical interlock. For example, FIG. 47 shows a cross-sectional view of a corner of a frame structure 7200, in which the outer flange 4710 is designed to fit into a corresponding channel in an adjacent photovoltaic roofing element (shown in dotted line and marked with reference number 4712). The wiring containment structure 4720 (here, a channel) is formed in the downward-facing surface of the frame structure, adjacent the flange 4710 but acting to keep wiring 4730 away from flange 4710. Fastener 4722 holds the wiring in place. In this embodiment, the channel is formed between a downward-protruding wall 4732 and the rest of the frame structure 4710. The channel can be continuous, or can be formed as a series of discontinuous sections. Of course, other shapes can be used for the wiring containment structure; in one embodiment, the structure is tube shaped (e.g., as one or more sections of conduit). While the wiring containment structure in the embodiment of FIG. 47 is shown as running vertically along the frame structure (i.e., in a top end-to-bottom end fashion), the person of skill in the art will appreciate that the wiring containment structure can run horizontally, diagonally, or in a combination of directions, depending on the particular wiring scheme envisioned.

Figure 49:
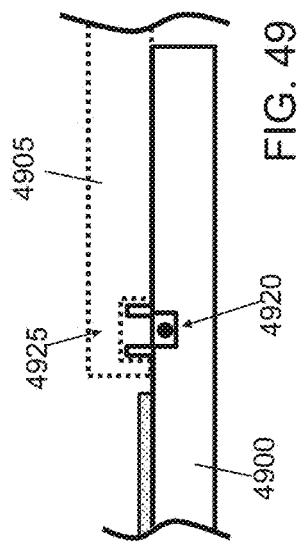
FIGS. 48 and 49 are partial schematic cross-sectional views of frame structures according to certain embodiments of the invention.
Figure 48:
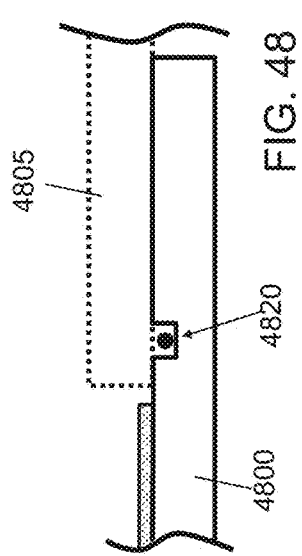

In the embodiments described above, the wiring containment structures are formed on the downward-facing surface of the frame structure, such that the wiring can be run underneath the photovoltaic roofing element. In other embodiments, the wiring is desired to be run along the top surface of the photovoltaic roofing element, for example, in the headlap area, such that it is covered by an overlying photovoltaic element. In such embodiments, a wiring containment structure can be formed on the upward-facing surface of the frame structure. For example, as shown in partial cross-sectional view in FIG. 48, the wiring containment structure 4820 can be formed as an indentation in the frame structure 4800, such that the wiring runs at or below the plane of the upward-facing surface of the frame structure, and does not protrude such that it interferes with the placement of an overlying photovoltaic roofing element 4805 (shown in phantom). In other embodiments, as shown in FIG. 49, the wiring containment structure 4920 is provided as a raised feature disposed at the upward-facing surface of frame structure 4900, and cooperates with a wiring containment structure 4925 formed on the downward-facing surface of the overlying photovoltaic roofing element 4905 (shown in phantom). In other embodiments, the wiring containment structure is disposed adjacent an edge of the frame structure.

Figure 50:
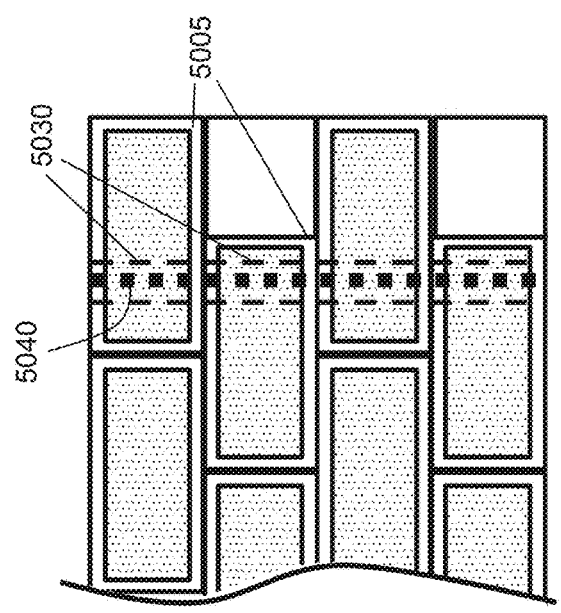
FIG. 50 is a cross-sectional plan view of photovoltaic roofing elements according to one embodiment of the invention disposed in an array.
Figure 51A:
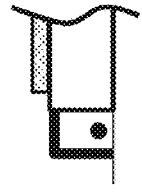
FIGS. 51A-51J form a set of partial cross-sectional views of frame structures according to a variety of embodiments of the invention.
Figure 51B:
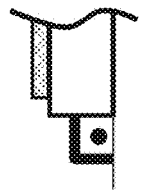
Figure 51C:
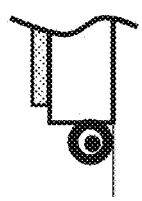
Figure 51D:
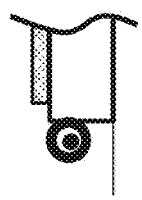
Figure 51E:
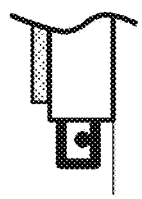
Figure 51F:
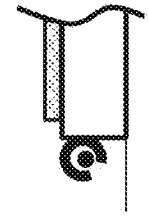
Figure 51G:
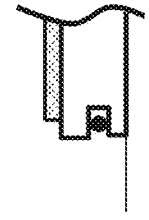
Figure 51H:
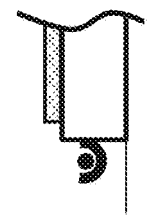
Figure 51I:
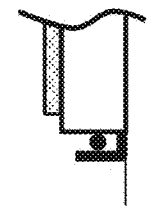
Figure 51J:
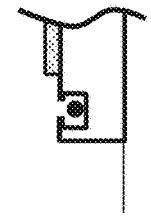

The wiring containment structures as described herein can perform a number of wiring routing functions. For example, as described above, the wiring containment structures can route wiring from the photovoltaic element to the periphery of the photovoltaic roofing element for connection to an adjacent photovoltaic roofing element and/or to a larger electrical system. In other embodiments, the wiring containment structure can allow for other wiring to be run along the photovoltaic roofing element. For example, photovoltaic roofing systems often include "home run" wiring that delivers collected power to a larger electrical system. Wiring containment structures can allow home run wiring to be routed from course to course, as shown in partial schematic plan view in FIG. 50. Wiring containment structures 5030 are formed on the downward-facing surfaces of the frame structures 5005; wiring 5040 runs down the roof in the wiring containment structures 5030. The wiring can be provided within a conduit, such that the conduit fits within the wiring containment structures.

A wide variety of wiring containment structures can be used in practicing various aspects of the present invention. Wiring containment structures can take a variety of shapes. For example, the wiring containment structure can be a series of holes or notches formed in downward-facing support structures, as described above. In other embodiments, the wiring containment structure is formed as a channel. In other embodiments, the wiring containment structure is a conduit. A given wiring containment structure can be formed as a unitary structure; or alternatively in spaced-apart sections (e.g., spaced-apart sections of conduit, or spaced-apart sections of channel). The wiring containment structure can include one or more fasteners, clips, or spots of adhesive to hold the wiring against a surface and away from the downward ends of any downward-facing support structures. In certain embodiments, the wiring containment structure includes a positive interlock that holds the wiring in the wiring containment structure (e.g., edges of a channel that are slightly narrower, so that the wiring can "snap" in). The wiring containment structure can be formed or molded as part of the frame, or can be added after formation of the frame, for example, via adhesive, clip, weld, cleat, rivet, or other mechanical fastener. When holes or other features requiring wiring feed-through are used, the wiring may need to be fed through before any connectors are attached. When the wiring containment structure has an opening (e.g., a channel or a clip), it can be configured to face the roof deck (e.g., to be flush against the roof deck) when installed, thereby holding the wiring in place.

A variety of suitable designs for wiring containment structures are shown in FIGS. 51A-51J.

Figure 52:
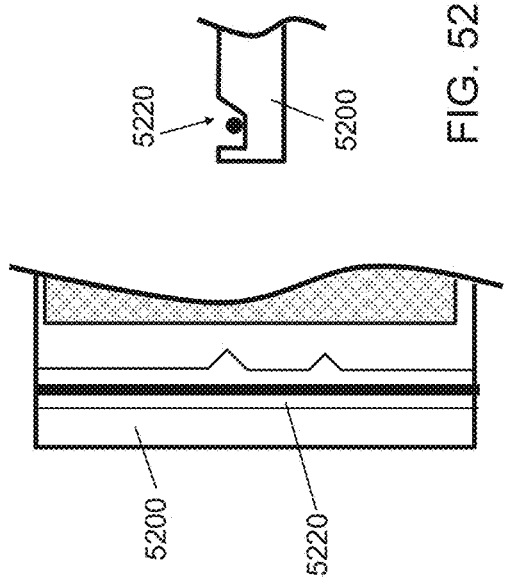
FIG. 52 is a pair of partial schematic views of a frame structure according to one embodiment of the invention.

When a wiring containment structure is a channel formed in an upward-facing surface of a frame structure, it can provide moisture handling as well. Preferably, any wiring or other electrical components disposed in a channel configured for moisture handling is otherwise water-resistant. One embodiment of such a channel is shown in schematic cross-sectional and top views in FIG. 52. Channel 5220 is formed in the upward-facing surface of frame structure 5200. The channel structure includes cut-outs that can collect water and admit it into the channel. Such cut-outs can be beveled, with a tapered edge.

Figure 53:
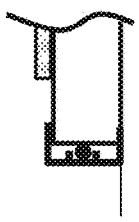
FIG. 53 is a partial cross-sectional view of a frame structure according to one embodiment of the invention.

In certain embodiments, the wiring containment structure is a separate component, assembled onto the frame structure (for example, during manufacturing or during installation). A schematic cross-sectional view of such a wiring containment structure is shone in FIG. 53. In this embodiment, the wiring containment structure is a separate piece, disposed along the edge of a frame structure.

Figure 54:
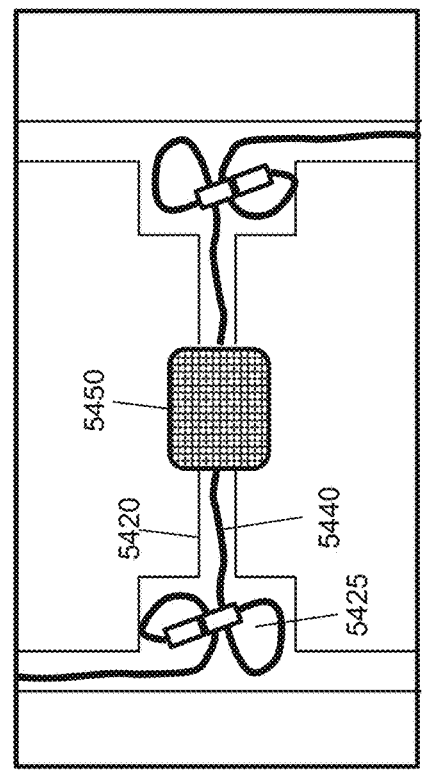
FIG. 54 is a partial plan view of a photovoltaic roofing element according to one embodiment of the invention.

In certain embodiments, the frame structure includes a pocket, formed as a relatively large recess at the upward- or downward-facing surface of the frame structure. The pocket can extend from the surface, defined by features extending therefrom; and/or can be formed as an indentation in the surface. The pocket can be sized to provide a place for the interconnection and protection of connectors. For example, as shown in partial schematic plan view in FIG. 54, wiring 5440 can run through wiring containment structure 5420 from a junction box 5450 to a pocket 5425, where interconnections to adjacent photovoltaic roofing elements can be made. In certain embodiments, the pockets are formed on the downward-facing surface of the frame structure, to allow the interconnection to be protected from the elements. The pockets can be sized to fit the mated connectors and some slack wiring to allow for ease of interconnection. Accordingly, in certain embodiments, mated connectors and/or slack wiring are disposed in the pocket, as shown in FIG. 54.

Another aspect of the invention is a roof comprising a roof deck and a photovoltaic roofing system as described herein disposed on the roof deck. The photovoltaic roofing systems described herein can be utilized with many different building structures, including residential, commercial and industrial building structures.

There can be one or more layers of material (e.g. underlayment), between the roof deck and the photovoltaic modules. The roof can also include one or more standard roofing elements, for example to provide weather protection at the edges of the roof, or in areas not suitable for photovoltaic power generation. In some embodiments, non-photovoltaically-active roofing elements are complementary in appearance or visual aesthetic to the photovoltaic roofing elements. Standard roofing elements can be interleaved at the edges of the photovoltaic arrays described herein. In certain embodiments, the photovoltaic roofing elements are simply disposed on top of an already-installed array of standard roofing elements (e.g., an already-shingled roof).

Another aspect of the invention is a kit for the installation of a photovoltaic roofing system, the kit comprising a plurality of photovoltaic roofing elements as described herein, a plurality of side flashing elements as described herein, adapted to interlock with the photovoltaic roofing elements of the kit. The kit can further include a plurality of top flashing elements as described herein. The kit can also include a plurality of cant strip elements as described herein.

Another aspect of the invention is a method for installing a photovoltaic array comprising disposing on a surface (e.g., a roof) and electrically interconnecting a plurality of photovoltaic modules as described herein. The disposal on the surface and electrical interconnections can be performed in any desirable order. The method can further include disposing a cover over substantially laterally aligned electrical elements of the photovoltaic array. In other embodiments, the method can comprise placement of wiring within wiring containment structures as described herein.

Further, the foregoing description of embodiments of the present invention has been presented for the purposes of illustration and description. It is not intended to be exhaustive or to limit the invention to the precise forms disclosed. As the person of skill in the art will recognize, many modifications and variations are possible in light of the above teaching. It will be apparent to those skilled in the art that various modifications and variations can be made to the present invention without departing from the scope of the invention. Thus, it is intended that the present invention cover the modifications and variations of this invention provided they come within the scope of the claims and their equivalents.

The invention claimed is:

1. A photovoltaic roofing system disposed on a roof deck having a top end and a bottom end, the photovoltaic roofing system comprising:
   a plurality of photovoltaic roofing elements each comprising
      a frame structure having an upward-facing surface and a downward-facing surface having a top end and a bottom end, the frame structure having a headlap zone and an exposure zone, with the exposure zone disposed toward the bottom end of the frame structure, and the headlap zone disposed toward the top end of the frame structure; and
      one or more photovoltaic elements held in the exposure zone of the frame structure,
   the photovoltaic roofing elements being contiguously disposed on the roof deck to provide contiguously-disposed photovoltaic elements, the contiguously-disposed photovoltaic elements together having a top edge facing the top end of the roof deck, a bottom edge facing the bottom end of the roof deck, and two side edges, wherein in each photovoltaic roofing element the frame structure includes sidelap portions disposed at lateral edges of the frame structure, the sidelap portions having geometries interlocking with sidelap portions of adjacent photovoltaic roofing elements to provide water drainage channels;
   a plurality of roofing elements disposed adjacent and along the side edges of the contiguously-disposed photovoltaic roofing elements, along their side edges; and
   side flashing elements disposed along the side edges of the contiguously-disposed photovoltaic roofing elements, each of the side flashing elements having a cross-sectional shape comprising a vertically-extending feature disposed adjacent one of the side edges of the contiguously-disposed photovoltaic elements and a flange extending away from a lateral side at a downward end of the vertically-extending feature, with the flange facing away from the contiguously-disposed photovoltaic roofing elements and being at least partially disposed between at least one of the plurality of roofing elements and the roof deck,
   wherein
      in each photovoltaic roofing element, the sidelap portion at one lateral edge includes an upward-facing channel; and the sidelap portion at the other lateral edge includes a downward-facing flange disposed in the upward-facing channel of an adjacent photovoltaic roofing element;
      in each photovoltaic roofing element, the frame structure is rigid;
      the contiguously-disposed photovoltaic roofing elements together are in a rectangular arrangement; and
      the photovoltaic roofing elements of the contiguously-disposed photovoltaic roofing elements are disposed in a plurality of overlapping rows, with the headlap zones of the photovoltaic roofing elements of an overlapped row being covered by the exposure zones of an overlapping row;
   the photovoltaic roofing system further comprising
      one or more top flashing elements disposed along the top edge of the contiguously-disposed photovoltaic roofing elements, the one or more top flashing elements having a bottom end disposed over the top edge of the contiguously-disposed photovoltaic roofing elements, and a top end disposed under one or more of the plurality of roofing elements disposed along the top edge of the contiguously-disposed photovoltaic roofing elements; and
      a cant strip disposed under the bottom edge of the contiguously-disposed photovoltaic elements and on top of an underlying course of roofing elements of the plurality of roofing elements.

2. The photovoltaic roofing system according to claim 1, wherein in each photovoltaic roofing element, the headlap zone is an attachment zone in which the photovoltaic roofing element is attached to the roof deck.

3. The photovoltaic roofing system according to claim 1, wherein in each photovoltaic roofing element, the frame structure is unitary and the headlap zone of the frame structure has at the top end thereof a first raised lip extending upward with respect to the upward-facing surface of the frame structure in the headlap zone.

4. The photovoltaic roofing system according to claim 1, wherein in each photovoltaic roofing element, at least one lateral side edge of the headlap zone does not include a ridge, such that water in the headlap zone can flow off of a side thereof.

5. The photovoltaic roofing system according to claim 1, wherein the one or more photovoltaic elements are sealed to the frame with a sealant.

6. The photovoltaic roofing system according to claim 1, wherein in each side flashing element, the flange extends at least 2 inches under the at least one of the plurality of roofing elements.

7. The photovoltaic roofing system according to claim 1, wherein the photovoltaic roofing elements are electrically interconnected.

8. The photovoltaic roofing system according to claim 1, wherein the roofing elements are roofing shingles.

* * * * *